United States Patent
Gomi

(10) Patent No.: US 8,203,689 B2
(45) Date of Patent: Jun. 19, 2012

(54) REDUCED-PRESSURE DRYING METHOD, METHOD OF MANUFACTURING FUNCTIONAL FILM, METHOD OF MANUFACTURING ELECTRO-OPTIC DEVICE, ELECTRO-OPTIC DEVICE, LIQUID CRYSTAL DISPLAY DEVICE, ORGANIC EL DISPLAY DEVICE, AND ELECTRONIC APPARATUS

(75) Inventor: Kazuhiro Gomi, Chino (JP)

(73) Assignee: Seiko Epson Corporation (JP)

( * ) Notice: Subject to any disclaimer, the term of this patent is extended or adjusted under 35 U.S.C. 154(b) by 1735 days.

(21) Appl. No.: 11/458,512

(22) Filed: Jul. 19, 2006

(65) Prior Publication Data

US 2007/0026166 A1 Feb. 1, 2007

(30) Foreign Application Priority Data

Aug. 1, 2005 (JP) ................................. 2005-222529

(51) Int. Cl.
*G02F 1/13* (2006.01)
*G02F 1/1337* (2006.01)
*F26B 21/06* (2006.01)

(52) U.S. Cl. .............................. 349/187; 34/78; 349/123

(58) Field of Classification Search ........................ 34/78
See application file for complete search history.

(56) References Cited

U.S. PATENT DOCUMENTS

| 2001/0007733 A1* | 7/2001 | Matsuyama et al. .............. 430/7 |
| 2002/0127340 A1* | 9/2002 | Kitano et al. .................. 427/294 |
| 2003/0175552 A1* | 9/2003 | Imamura et al. .............. 428/690 |

FOREIGN PATENT DOCUMENTS

| JP | 2000-100890 | 4/2000 |
| JP | 2000-241623 | 9/2000 |
| JP | 2001-205165 | 7/2001 |
| JP | 2001-269607 | 10/2001 |
| JP | 2001-319852 | 11/2001 |
| JP | 2003-234273 | 8/2003 |
| JP | 2004-047797 | 2/2004 |
| JP | 2004-079682 | 3/2004 |

* cited by examiner

*Primary Examiner* — Wen-Ying P Chen
(74) *Attorney, Agent, or Firm* — Harness, Dickey & Pierce, P.L.C.

(57) ABSTRACT

A reduced-pressure drying method includes: decompressing a second chamber communicated with a first chamber housing a base material coated with a liquid substance containing a solvent to predetermined operative pressure by a decompressing device; leaving the first chamber closed in response to reaching the predetermined operative pressure until the evaporated solvent raising the pressure in the first chamber to predetermined pressure; communicating the first chamber with the pressure raised to the predetermined pressure with the second chamber; and discharging the vapor of the solvent dispersed in the first and the second chambers by the decompressing device.

15 Claims, 9 Drawing Sheets

REDUCED-PRESSURE DRYING METHOD, METHOD OF MANUFACTURING FUNCTIONAL FILM, METHOD OF MANUFACTURING ELECTRO-OPTIC DEVICE, ELECTRO-OPTIC DEVICE, LIQUID CRYSTAL DISPLAY DEVICE, ORGANIC EL DISPLAY DEVICE, AND ELECTRONIC APPARATUS

BACKGROUND OF THE INVENTION

1. Technical Field

The present invention relates to a reduced-pressure drying method for drying a base material coated with a liquid substance under reduced pressure to form a film on a surface of the base material, a method of manufacturing a functional film, a method of manufacturing an electro-optic device, an electro-optic device, a liquid crystal display device, an organic EL display device, and an electronic apparatus.

2. Related Art

A reduced-pressure drying method using a reduced-pressure drying device, which is used for forming a film on a surface of a wafer-like substrate (base material) made from, for example, semiconductor by applying a liquid substance including film forming material and is capable of drying the substrate by evaporating a fluxing material (solvent) included in the liquid substance under reduced pressure, is known. For example, in JP-A-2004-47797, there is proposed a reduced-pressure drying device provided with an airtight container for keeping a substrate coated with a coating liquid (photoresist) under reduced-pressure atmosphere, an evacuating means for evacuating the airtight container, and a current plate having a size equal to or larger than the effective area of the substrate and disposed in the airtight container so as to face the substrate.

Further, as a reduced-pressure drying method using the reduced-pressure drying device described above, there is proposed a reduced-pressure drying method including the step of disposing a current plate so as to face, with a gap therebetween, a surface of a substrate mounted on a substrate mounting section provided inside an airtight container, the step of evacuating the airtight container up to the pressure with which a solvent component is rapidly evaporated from a coating liquid, and the step of changing a setting value of an outlet flow to at least two stages while the solvent component is rapidly evaporating from the coating liquid.

In such a reduced-pressure drying method, by changing the setting value of the outlet flow while the solvent component of the coating liquid is rapidly evaporating, a stage in which the solvent evaporates at a high rate and a stage in which the solvent evaporates at a low rate are combined, thereby correcting a cross-sectional shape of the coating film in the periphery of the substrate. Thus, an outlet flow pattern capable of obtaining a planarized coating film with in-plane uniformity can allegedly be set with ease.

As described above, in manufacturing processes of a majority of electronic devices such as semiconductors, there is adopted a process for forming a coating film (a functional film) composed of various kinds of film-forming materials on a surface of a base material such as a wafer by applying a liquid substance containing the film-forming materials (functional materials) on the base material.

However, in the drying process for forming the coating film by drying the liquid substance, it is quite difficult to dry the liquid substance so as to obtain a resulted coating film more even and having an even film thickness distribution throughout the whole surface of the base material, even by using the reduced-pressure drying device and the reduced-pressure drying method described above. Because, the liquid substance is of great variety, and the saturated vapor pressure and the rheologic properties (properties such as viscosity, elasticity, plasticity, or thixotropic property) vary by each of the materials. Further, a behavior of the liquid substance in the drying process such as the evaporation rate also varies by the volume ratio or the surface area ratio between the solute and the solvent included in the liquid substance.

Therefore, even if the rate of evaporation of the solvent from the liquid substance under the reduced pressure is controlled by changing the setting of the outlet flow using the reduced-pressure drying method of the related art described above, a fluidity (convection) of the liquid substance occurs in the drying process, thus the evenness of the film thickness is problematically degraded by the surface tension thereof. Further, even if the direction of solvent vapor ejection is controlled by the current plate, since the vapor density (or the vapor pressure) distribution is different between the central portion and the peripheral portion of the base material, as a result, in-plane distribution of the film thickness is problematically caused by the difference in drying rate.

SUMMARY

The invention addresses the technical problems described above, and has an advantage of providing a reduced-pressure drying method capable of optimizing the evaporation rate of the solvent in the applied liquid substance in the drying process in accordance with the type of the liquid substance, and of performing the reduced-pressure drying in a condition in which the vapor pressure distribution of the solvent is substantially even throughout the coated surface, a method of manufacturing a functional film and a method of manufacturing an electro-optic device both using the reduced-pressure drying method, an electro-optic device, a liquid crystal display device, an organic EL display device, and an electronic apparatus.

A reduced-pressure drying method according to an aspect of the invention is a reduced-pressure drying method using a reduced-pressure drying device having a second chamber capable of being decompressed and a first chamber capable of communicating with the second chamber, for drying the liquid substance applied to a base material by evaporating a solvent of the liquid substance under reduced pressure, and includes the step of decompressing a second chamber communicated with a first chamber housing a base material coated with a liquid substance containing a solvent to predetermined operative pressure by a decompressing device, the step of leaving the first chamber closed in response to reaching the predetermined operative pressure until the evaporated solvent raising the pressure in the first chamber to predetermined pressure, the step of communicating the first chamber with the pressure raised to the predetermined pressure with the second chamber, and the step of discharging the vapor of the solvent dispersed in the first and the second chambers by the decompressing device.

The behavior of the liquid substance under reduced pressure is affected by the vapor pressure or the evaporation rate varies in accordance with the types or compounding conditions of the solute and the solvent composing the liquid substance. According to this method, the base material coated with the liquid substance is housed in the first chamber and decompressed to predetermined operative pressure. After then, in the leaving step, evaporation of the solvent of the liquid substance proceeds in the condition in which the first chamber is sealed, and the liquid substance is left until the pressure in the first chamber becomes predetermined pressure. In the communicating step, the first chamber whose pressure has increased to the predetermined pressure and the second chamber are communicated with each other, and in the discharging step, the vapor of the solvent dispersed in the first and the second chambers is discharged by the decompressing device. Therefore, since the evaporation of the solvent in the liquid substance proceeds in the first chamber sealed under the predetermined operative pressure, the drying of the liquid substance can be performed without being influenced by the discharge operation of the vacuum pump, in the evaporation rate corresponding to the predetermined operative pressure, and also in the condition in which the vapor pressure distribution of the solvent is substantially even throughout the coated surface until the predetermined pressure is reached. Further, since the first and the second chambers are communicated with each other when the evaporated solvent increase the pressure in the first chamber to the predetermined pressure, namely higher than the predetermined operative pressure, it becomes possible to easily disperse the vapor of the solvent in the first chamber to the second chamber with lower pressure and to discharge it by the decompressing device. Namely, by setting the predetermined operative pressure and the predetermined pressure in the first chamber in accordance with the type of the liquid substance to be dried, the evaporation rate of the solvent of the applied liquid substance can be optimized, thus the reduced-pressure drying method capable of performing the reduced-pressure drying operation in the condition in which the vapor pressure distribution of the solvent is substantially even throughout the coated surface can be provided.

Further, the predetermined operative pressure is preferably higher than the vapor pressure of the solvent of the liquid substance. In the reduced pressure condition, the solvent of the liquid substance starts evaporating because of the kinetic energy that the solvent molecules have even if the extent of the decompression is not reached the vapor pressure of the solvent. When the decompression comes close to the vapor pressure, the evaporation occurs rapidly, and in some cases, bumping may be caused. According to this process, since the predetermined operative pressure in the decompressing step is higher than the vapor pressure of the solvent of the liquid substance, it becomes possible to prevent rapid evaporation of the solvent, and reduce the occurrence of the bumping. Therefore, it can be reduced that the film shape becomes unstable after drying operation due to the bumping. Further, since the bumping may occur everywhere on the base material coated with the liquid substance, it can also be reduced that the in-plane thickness variation becomes large. Namely, it is possible to provide the reduced-pressure drying method capable of drying the liquid substance under the reduced pressure in the condition in which the dried film shape is flat, and in-plane thickness variation is small.

Further, the predetermined pressure is equal to the sum of the predetermined operative pressure and a vapor pressure in the case in which a predetermined amount of the solvent evaporates in the sealed first chamber, and in the discharging step, the discharging is preferably performed under the pressure higher than the predetermined pressure.

According to this method, the predetermined pressure is set to be the same as the sum of the predetermined operative pressure and the vapor pressure in the case in which a predetermined amount of solvent evaporates in the sealed first chamber, and the discharge is performed under the pressure higher than the predetermined pressure in the discharging step. Therefore, in the discharge step, since the discharge is performed under the pressure higher than the predetermined pressure, it can be prevented that the solvent evaporates more than the predetermined amount that is evaporated in the leaving step. Therefore, it becomes possible to control the amount of solvent evaporated in the leaving step, and it becomes possible to presume the ratio between the solute and the solvent in the reduced-pressure drying process. Accordingly, by previously setting the amount of solvent to be evaporated preferably, the reduced-pressure drying can be performed in more optimized conditions. It should be noted that the predetermined amount of the solvent here can be set as the total amount of the solvent or can be an amount obtained by dividing the total amount of the solvent depending on the type of the liquid substance.

Further, the decompression step through the discharging step are preferably repeated to perform drying of the liquid substance applied to the base material. According to this process, since the decompressing process through the discharging step are repeatedly performed, the solvent can be gradually evaporated in accordance with the total amount of the liquid substance applied on the base material, thereby providing reduced-pressure drying method capable of drying in the reduced pressure the liquid substance in a condition in which the shape of the dried film is flatter, and in-plane thickness variation is smaller.

Further, a reduced-pressure drying method according to another aspect of the invention is a reduced-pressure drying method using a reduced-pressure drying device having a second chamber capable of being decompressed and a first chamber capable of communicating with the second chamber, for drying the liquid substance applied to a base material by evaporating a solvent of the liquid substance under reduced pressure, and includes the step of decompressing a second chamber communicated with a first chamber housing a base material coated with a liquid substance containing a solvent to predetermined operative pressure with which the solvent is evaporated from the liquid substance to increase the viscosity of the liquid substance to viscosity right before viscosity affecting a shape of a film, the step of leaving the first chamber closed in response to reaching the predetermined operative pressure until the evaporated solvent raising the pressure in the first chamber to predetermined pressure, the step of communicating the first chamber with the pressure raised to the predetermined pressure with the second chamber, and the step of discharging the vapor of the solvent dispersed in the first and the second chambers by the decompressing device.

According to this method, in the decompressing step, the first and the second chambers are decompressed to predetermined operative pressure with which the solvent of the liquid substance of the base material housed in the first chamber is evaporated to increase the viscosity to the viscosity right before the viscosity affecting the shape of the film. Therefore, in the decompressing step, most part of the solvent is evaporated in a condition in which the evaporation is not affected to the shape of the film, and the ratio of the solvent to the solute drops. After then, in the leaving step, evaporation of the solvent of the liquid substance proceeds in the condition in which the first chamber is sealed, and the liquid substance is left until the pressure in the first chamber becomes predetermined pressure. Therefore, the evaporation of the solvent proceeds only by dispersion of the solvent in the sealed first chamber. In the communicating step, the first chamber whose pressure has increased to the predetermined pressure and the second chamber are communicated with each other, and in the discharging step, the vapor of the solvent dispersed in the first and the second chambers is discharged by the decompressing device. Therefore, it is possible to provide the reduced-pressure drying method capable of performing reduced-pressure drying with slow evaporation rate of the solvent in the leaving step so as not to affect the shape of liquid substance without receiving any influence of the discharge air by the decompressing device.

Further, it is possible to set the predetermined pressure described above to be about the saturated vapor pressure of the solvent of the liquid substance in the first chamber added with the predetermined operative pressure. According to this process, in the leaving process, the base material which is coated with the liquid substance is left until the solvent evaporates in the sealed first chamber to become the condition reaching the almost saturated vapor pressure. Therefore, between the solvent evaporated on the surface of the substrate and the liquid substance become in almost balanced condition, and the reduced-pressure drying can be performed in a condition in which the in-plane vapor pressure distribution is more even. Further, since the evaporation rate becomes very slow as it comes near to the almost balanced condition, influence of the evaporation rate to the shape of the liquid substance can be reduced.

In the reduced-pressure drying method according to the above aspects of the invention, in the communicating step, the capacity of the second chamber is preferably greater than the capacity of the first chamber. According to the configuration, since the second chamber has larger capacity than the sealed first chamber, it is easy to disperse the vapor of the solvent evaporated in the first chamber to the second chamber.

Further, in the reduced-pressure drying method according to the above aspects of the invention, the second chamber is preferably decompressed to be lower than the predetermined operative pressure prior to the communication step. According, since the pressure in the second chamber is decreased compared to the pressure in the first chamber before the communication step, when the first and the second chambers are communicated with each other in the communicating step, the vapor of the solvent in the first chamber can easily be dispersed to the second chamber.

Further, a reduced-pressure drying method according to another aspect of the invention is a reduced-pressure drying method using a reduced-pressure drying device having a second chamber capable of being decompressed and a first chamber capable of communicating with the second chamber, for drying the liquid substance applied to a base material by evaporating a solvent of the liquid substance under reduced pressure, and includes the step of decompressing a second chamber isolated from a first chamber housing a base material coated with a liquid substance containing a solvent to predetermined operative pressure by a decompressing device, the step of communicating the first chamber with the second chamber in response to the second chamber reaching the predetermined operative pressure, and the step of discharging the vapor of the solvent dispersed in the first and the second chambers.

In the case in which the vapor pressure of the solvent of the liquid substance is relatively high, and most part of the solvent evaporates in the decompressing step for creating the predetermined operative pressure, it becomes difficult to dry under reduced pressure in the ratio between the solute and the solvent with which the shape of the liquid substance is stably maintained. According to this method, since in the communication step the first and the second chambers are communicated when the second chamber has reached the predetermined operative pressure, the first chamber can rapidly be decompressed without tracing the intermediate decompressing step. Therefore, it becomes possible to rapidly evaporate the solvent, and the reduced-pressure drying can be performed while preventing the variation in the shape of the liquid substance in the decompression process.

Further, the predetermined operative pressure is preferably higher than the vapor pressure of the solvent of the liquid substance. In the case in which the second chamber decompressed to the predetermined operative pressure is communicated with the first chamber to cause the first chamber to be decompressed rapidly and accordingly the solvent also evaporated rapidly from the liquid substance, there might be caused the bumping. According to this method, the predetermined operative pressure is higher pressure than the vapor pressure of the solvent of the liquid substance, therefore, occurrence of such bumping can be reduced. Namely, it can be reduced that the shape of the dried film becomes uneven in the plane due to the bumping.

Further, in the reduced-pressure drying method according to the above aspects of the invention, in the discharging step, after the drying of the liquid substance has proceeded to increase the viscosity to be sufficient to fix the film shape, an active discharge for increasing the discharge rate of the decompressing device is preferably performed. According to this process, in the case in which the liquid substance has already been increased in the viscosity sufficient to hardly receive the influence of the discharge, even if the active discharge for increasing the discharge rate of the decompressing device in the discharging step, there is no possibility of varying the film shape. Therefore, by performing the active discharge, it becomes possible to promote rapid drying of the liquid substance. Namely, the reduced-pressure drying process can efficiently be performed.

Further, in the reduced-pressure drying method according to the above aspects of the invention, in the discharging step, an inactive gas is preferably introduced in the first chamber so as to keep the pressure in the first chamber higher than the predetermined operative pressure. According to this process, since in the discharging step, the inactive gas is externally introduced so as to keep the pressure in the first chamber higher than the predetermined operative pressure, the surface of the liquid substance is kept higher than the predetermined operative pressure, thus the evaporation of the residual solvent in the liquid substance can be prevented. Therefore, in the discharging step for discharging the vapor of the solvent, since the evaporation is not promoted more than necessary, the reduced pressure drying can be performed while maintaining the ratio between the solute and the solvent to prevent occurrence of variation in the shape of the liquid substance.

Further, in the reduced-pressure drying method according to the above aspects of the invention, the discharging step includes, dispersing the vapor of the solvent in the first chamber to the second chamber, isolating the first chamber from the second chamber, and discharging the vapor of the solvent dispersed in the second chamber by the decompressing device. According to the process, in the discharging step, since the vapor of the solvent is once dispersed to the second chamber, and then the first chamber is sealed, the liquid substance need not be affected by the airflow in discharging the dispersed vapor of the solvent. Namely, it can be prevented that the vapor pressure distribution in the surface of the liquid substance is fluctuated by the influence of the discharge air, to cause in-plane thickness variation in the dried film.

The method of manufacturing a functional film according to another aspect of the invention is a method of manufacturing a functional film by applying a liquid substance including a functional material to a base material, drying the liquid substance, wherein the liquid substance is dried using the reduced-pressure dying method according to above aspects of the invention.

According to this method, since the liquid substance is dried using the reduced-pressure drying method according to above aspects of the invention, the solvent can be evaporated from the liquid substance including the functional material at an optimum evaporation rate, and it is possible to dry the liquid substance under reduced pressure so that the vapor pressure distribution becomes substantially even throughout the surface. Namely, the functional film can be manufactured in a condition in which after reduced-pressure drying process, the shape is flat and the in-plane thickness variation is small.

A method of manufacturing an electro-optic device according to still another aspect of the invention is a method of manufacturing an electro-optic device having a pair of substrates and a functional film for forming a pixel disposed on at least one of the pair of substrates, and the functional film is manufactured using the method of manufacturing the functional film according to the above aspects of the invention.

According to the present method, since the functional film is manufactured using the method of manufacturing a functional film according to the above aspect of the invention, after the reduced-pressure drying process, the electro-optic device provided with a functional film formed in a condition in which the shape is flat, and in-plane thickness variation is small can be manufactured. Namely, the electro-optic device having small variations in electro-optic characteristics of a pixel derived from the functional film can be manufactured.

An electro-optic device according to another aspect of the invention is an electro-optic device having a pair of substrates and a functional film for forming a pixel disposed on at least one of the pair of substrates, and the functional film is manufactured using the method of manufacturing the electro-optic device according to the above aspects of the invention.

According to the present configuration, since the functional film is manufactured using the method of manufacturing an electro-optic device according to the above aspect of the invention, after the reduced-pressure drying process, the electro-optic device provided with a functional film formed in a condition in which the shape is flat, and in-plane thickness variation is small can be provided. Namely, the electro-optic device having small variations in electro-optic characteristics of a pixel derived from the functional film can be provided.

A liquid crystal display device according to another aspect of the invention includes a pair of substrates provided with an electrode, an oriented film as a functional film covering the electrode in a range corresponding at least to a display area, liquid crystal held by the pair of substrates via the oriented film, wherein the oriented film is manufactured using the method of manufacturing a functional film according to the above aspect of the invention.

According to the present configuration, since the oriented film is manufactured using the method of manufacturing a functional film according to the above aspect of the invention, after the reduced-pressure drying process, the liquid crystal display device provided with a oriented film formed in a condition in which the shape is flat, and in-plane thickness variation is small can be provided. Namely, the liquid crystal display device with preferable visible quality, little orientation variation, and little display variation caused by the thickness variations of oriented film can be provided.

A liquid crystal display device according to another aspect of the invention includes a pair of substrates, and a color element as a functional film partitioned by a bank on at least one of the pair of substrates, liquid crystal held by the pair of substrates, wherein the color element is manufactured using the method of manufacturing a functional film according to the above aspect of the invention.

According to the present configuration, since the color element is manufactured using the method of manufacturing a functional film according to the above aspect of the invention, after the reduced-pressure drying process, the liquid crystal display device provided with a color element formed in a condition in which the shape is flat, and in-plane thickness variation is small can be provided. Namely, the liquid crystal display device with preferable visible quality, little color variation, and little display variation caused by the thickness variations of color element can be provided.

An organic EL display device according to another aspect of the invention includes a pair of substrates, and a light emitting layer as a functional film partitioned by a bank on at least one of the pair of substrates wherein the light emitting layer is manufactured using the method of manufacturing a functional film according to the above aspect of the invention.

According to the present configuration, since the light emitting layer is manufactured using the method of manufacturing a functional film according to the above aspect of the invention, after the reduced-pressure drying process, the organic EL display device provided with a light emitting layer formed in a condition in which the shape is flat, and in-plane thickness variation is small can be provided. Namely, the organic EL display device with preferable visible quality, and little display variation such as light emitting variation or color variation caused by the thickness variation of light emitting layer can be provided.

An electronic apparatus according to another aspect invention includes any one of the electro-optic device according to the above aspect of the invention, the liquid crystal display device according to the above aspect of the invention, the organic EL display device according to the above aspect of the invention.

According to this configuration, the electronic apparatus according to this aspect of the invention implements one of the electro-optic device having the functional film forming the pixel having a flat shape and little in-plane thickness variation, thereby providing stable electro-optic characteristics, the liquid crystal display device with preferable visible quality, little orientation variation, and little display variation caused by the thickness variations of oriented film, the liquid crystal display device with preferable visible quality, little color variation, and little display variation caused by the thickness variations of color element, and the organic EL display device with preferable visible quality, and little display variation such as light emitting variation or color variation caused by the thickness variation of light emitting layer. Therefore, the electronic apparatus capable of displaying information such as an image with a preferable visual quality can be provided.

BRIEF DESCRIPTION OF THE DRAWINGS

The invention will now be described with reference to the accompanying drawings, wherein like numbers refer to like elements.

DESCRIPTION OF THE EMBODIMENTS

In an embodiment of the invention, descriptions are provided based on a reduced-pressure drying method for drying a liquid substance by evaporating the solvent thereof under reduced pressure using a reduced-pressure drying device provided with at least a chamber for housing a substrate coated with a liquid substance including a functional material, and a decompressor capable of reducing pressure in the chamber.

Reduced-Pressure Drying Device

Figure 1A:
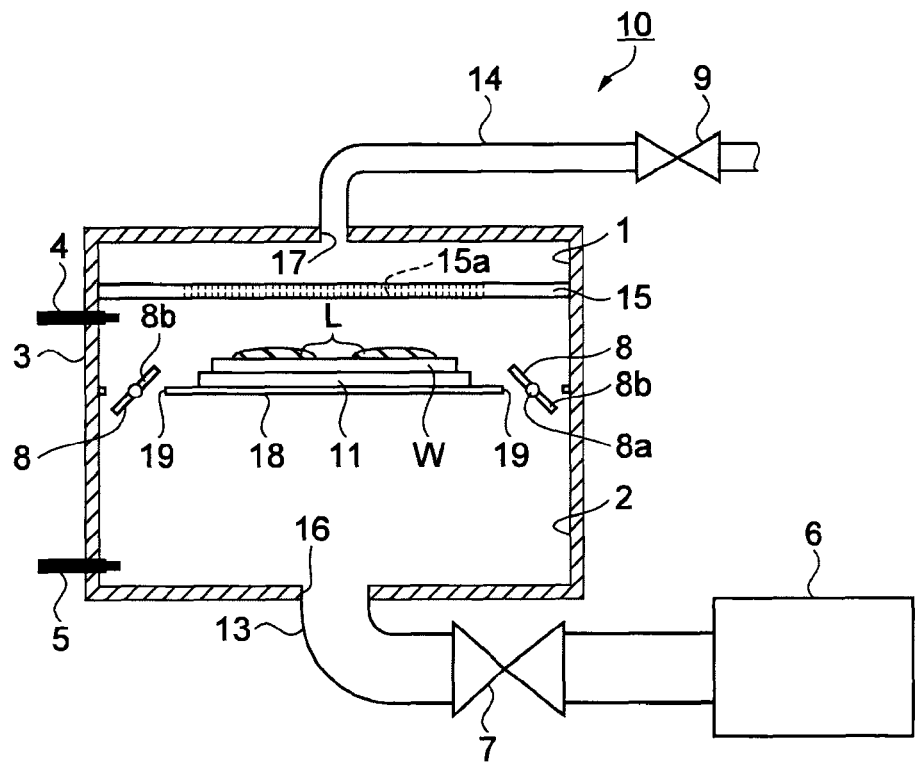
FIGS. 1A and 1B are schematic views showing the structure of a reduced-pressure drying device according to an embodiment of the invention.
Figure 1B:
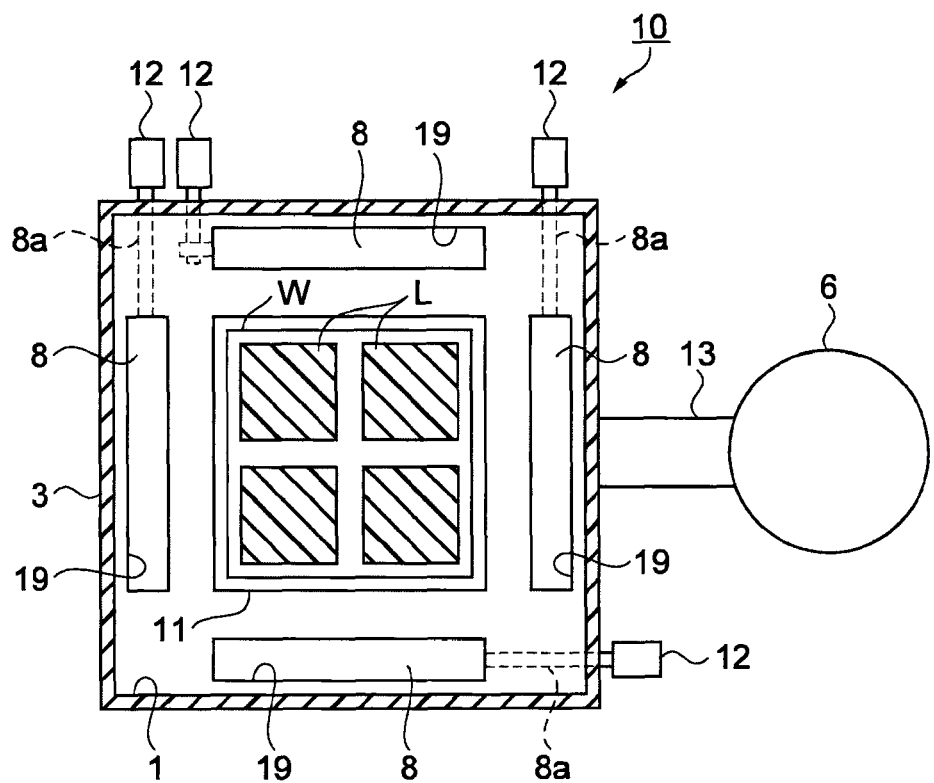

Firstly, the reduced-pressure drying device will be explained. FIGS. 1A and 1B are schematic views showing the structure of the reduced-pressure drying device according to an embodiment of the invention. In detail, FIG. 1A is a schematic side cross-sectional view of the device, and FIG. 1B is a schematic plane cross-sectional view of the device. As shown in FIG. 1A, the reduced-pressure drying device 10 is a device for housing the substrate W coated with the liquid substance L inside the chamber 3, and for evaporating the solvent of the liquid substance L under reduced pressure to dry the substrate W.

The chamber 3 including a first chamber 1 located on the upper side of the drawing and a second chamber 2 on the lower side thereof, and is further provided with a partition section 18 for partitioning the inside of the chamber 3 so that the volume of the second chamber 2 becomes larger than the first chamber 1. On the first chamber 1 side of the partition section 18, there is provided a mounting stage 11 for mounting the substrate W. Further, there is provided a current plate 15 disposed so as to face the mounting stage 11 with a predetermined distance. The current plate 15 is provided with a plurality of vent holes 15a, through which a gas passes, in a rage corresponding to the area of the substrate W to be mounted thereon.

Around the center of the upper section of the first chamber 1, there is provided a connection hole 17, to which one end of a pipe 14 capable of feeding-in nitrogen ($N_2$) gas as an inactive gas to the first chamber 1 is connected. The other end of the pipe 14 is connected to an $N_2$ gas supply source (not shown) via an $N_2$ valve 9. Further, on the sidewall section of the first chamber 1, there is provided a vacuum meter 4 capable of measuring the pressure reduction state in the first chamber 1. The vacuum meter 4 is electrically connected to a control section 20 (see FIG. 2) described later, and outputs a pressure value thereto.

Around the center of the lower section (bottom face), there is provided a connection hole 16, to which one end of a pipe 13 is connected. The other end of the pipe 13 is connected to a vacuum pump 6 as a decompressor capable of decompressing the second chamber 2 via a vacuum valve 7. As the vacuum pump 6, an oil-less pump or a turbo-molecular pump is used, for example. Further, these pumps can be used in combination so that setting of operative pressure for achieving the target pressure reduction state becomes possible. Further, on the sidewall section of the second chamber 2, there is provided a vacuum meter 5 capable of measuring the pressure reduction state in the second chamber 2. The vacuum meter 5 and the vacuum pump 6 are also electrically connected to the control section 20 (see FIG. 2) described later, and the control section 20 is configured to be able to detect the output (pressure value) of the vacuum meter 5 to control the decompression rate of the vacuum pump 6.

As shown in FIGS. 1A and 1B, the partition 18 is provided with four communication openings 19, through which the first chamber 1 and the second chamber 2 of the chamber 3 are communicated with each other, along the sides of the mounting stage 11. In the portions where the four communication openings 19 open, there are respectively provided four communication valves 8 whose rotational shafts 8a are respectively linked with four motors 12 attached to the outer wall sections of the chamber 3. In the communication valves 8, the valve members 8b attached to the rotational shafts 8a open or close the respective communication openings 19 when the motors 12 are driven to make the rotational shafts 8a rotate. When the communication valves 8 close the communication openings 19, the first chamber 1 and the second chamber 2 are airtightly separated from each other. The four motors 12 are each electrically connected to the control section 20 (see FIG. 2), and the control section 20 drives the four motors 12 independently from each other to control the opening/closing state of each of the communication valves 8.

The reduced-pressure drying device 10 is capable of decompressing the first chamber 1 and the second chamber 2 by driving the vacuum pump 6 in the condition of closing a door (not shown) to seal the chamber 3 and opening the communication valves 8. Further, it is possible to decompress only the second chamber 2 by driving the vacuum pump 6 while closing the communication valves 8 to close the communication openings 19.

Figure 2:
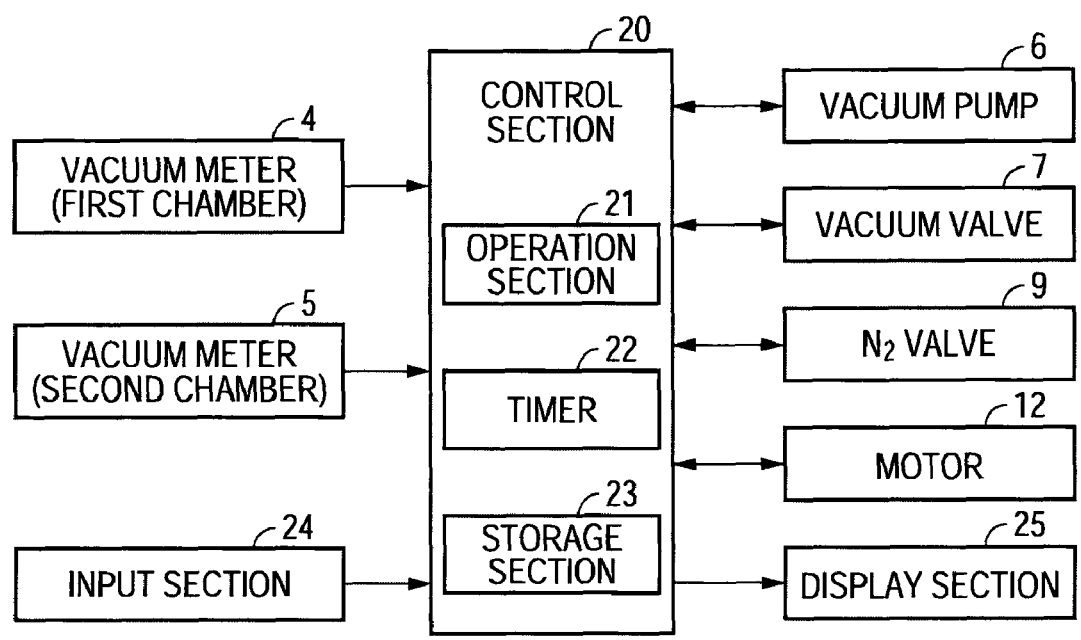
FIG. 2 is a block diagram showing the electrical or the mechanical configuration of the reduced-pressure drying device according to the embodiment of the invention.

FIG. 2 is a block diagram showing the electrical or the mechanical configuration of the reduced-pressure drying device according to the embodiment of the invention. As shown in FIG. 2, the reduced-pressure drying device 10 includes the control section 20 provided with an operation section 21 with a CPU, a timer 22 for measuring time, and a storage section 23 storing the reduced-pressure drying condition data such as a reduced-pressure drying profile. The two vacuum meters 4, 5 are electrically connected to the control section 20, thus the control section 20 can detect the pressure reduction condition of each of the first and the second chambers 1, 2. Further, the vacuum pump 6 is also electrically connected thereto, thus the drive thereof, the evacuation rate, and so on are controlled. The four motors 12 are electrically connected thereto, and by controlling the drive of the motors 12, the open/close state of each of the communication valves 8 is controlled. As the vacuum valves 7 and the $N_2$ valve 9, electromagnetic valves are used, which are also electrically connected to the control section 20, thus the opening and closing thereof are controlled by the control section 20. Further, an input section 24 including a keyboard, a recording media driving device capable of communicating data with the recording media, and so on, and a display section 25 are electrically connected thereto. It is possible to input the reduced-pressure drying conditions such as the reduced-pressure drying profile from the input section 24, and to store them in the storage section 23. The display section 25 can display various data input thereto, the pressure values of the first and the second chambers 1, 2 respectively detected by the vacuum meters 4, 5, and the working state of the reduced-pressure drying device 10 such as ON/OFF state of the device, open/closed state of each of the various valves, or the elapsed time corresponding to the reduced-pressure drying step measured by the timer 22. The operation section 21 is capable of operating the amount of evaporation of the solvent and so on based on the data included in the reduced-pressure drying profile stored in the storage section 23 and the outputs (pressure values) of the vacuum meters 4, 5. Further, it is possible to perform the reduced-pressure drying operations by reading out the number of times of the reduced-pressure drying operations set previously and included in the reduced-pressure drying profile and so on.

First Embodiment

Figure 3:
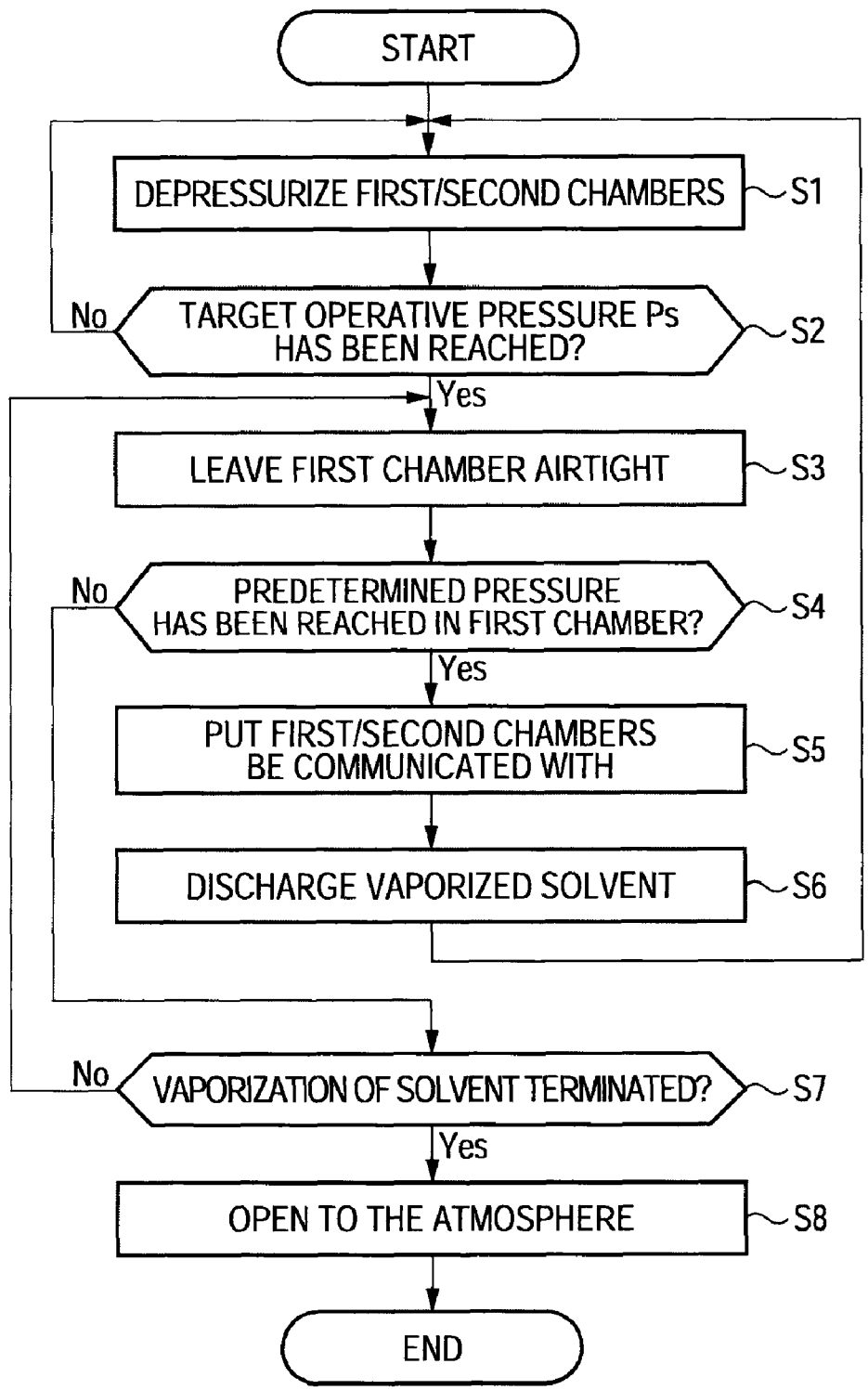
FIG. 3 is a flowchart showing a reduced-pressure drying method according to a first embodiment of the invention.
Figure 4:
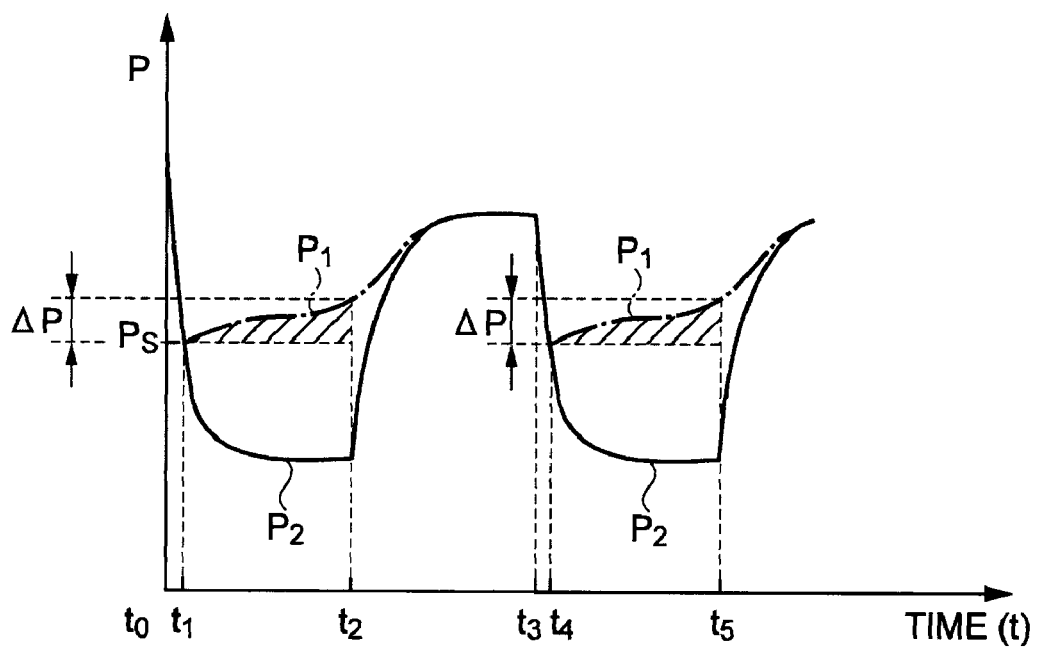
FIG. 4 is a graphic representation of a reduced-pressure drying profile of the reduced-pressure drying device corresponding to the flowchart shown in FIG. 3.

The reduced-pressure drying method according to the first embodiment applying the invention will now be explained with reference to FIGS. 3 and 4. FIG. 3 is a flowchart showing a reduced-pressure drying method according to the first embodiment of the invention. And, FIG. 4 is a graphical representation of the reduced-pressure drying profile of the reduced-pressure drying device. In detail, FIG. 4 is a graphical representation of the pressure change in the first and the second chambers 1, 2 with respect to the elapsed time of the reduced-pressure drying corresponding to the flowchart shown in FIG. 3. The vertical axis of the graph is a logarithmic axis representing the pressure P. Further, it shows an evaporation amount controlling type of reduced-pressure drying method performing the reduced-pressure drying by controlling the evaporation amount of the solvent evaporated from the liquid substance L.

Evaporation Amount Control Type of Reduced-Pressure Drying Method

As shown in FIG. 3, the reduced-pressure drying method according to the first embodiment includes a decompressing step (step S1) for housing the substrate W coated with the liquid substance L in the first chamber 1, and decompressing the first and the second chambers 1, 2 to predetermined operative pressure Ps by the vacuum pump 6 in the condition in which the first and the second chambers are communicated with each other. Further, there are provided a leaving step (step S3) for leaving the first chamber 1 until the pressure of the first chamber 1 rises to a predetermined value after sealing the first chamber when the pressure of the first chamber reaches the predetermined operative pressure Ps, and a communicating step (step S5) for communicating the first chamber 1 whose pressure has risen to the predetermined pressure with the second chambers 2. Further, there is provided a discharging step (step S6) for discharging the vapor of the solvent dispersed in the first and the second chambers 1, 2 with the vacuum pump 6. Still further, there is provided a step (step S7) of judging whether or not the evaporation of the solvent has terminated by operating the amount of the solvent evaporated in the sealed first chamber 1.

The step S1 shown in FIG. 3 is the decompressing step. In the step S1, the substrate W coated with the liquid substance L is mounted on the mounting stage 11 in the first chamber 1, and airtightly housed in the chamber 3 by closing the door. The control section 20 firstly confirms that the $N_2$ valve 9 is closed, and if closed, it drives the motors 12 to open the four communication valves 8 to form the condition in which the first and the second chambers 1, 2 are communicated with each other through the communication openings 19. Then, as shown in FIG. 4, it opens the vacuum valve 7 and drives the vacuum pump 6 to start (time $t_0$) the decompression for reducing the pressure $P_1$ of the first chamber 1 and the pressure $P_2$ of the second chamber 2 so as to reach the predetermined operative pressure Ps. And then, it proceeds to the step S2.

A step S2 shown in FIG. 3 is a step of judging whether or not the pressure $P_1$ of the first chamber 1 and the pressure $P_2$ of the second chamber 2 reach the target operative pressure Ps. The control section 20 detects the outputs from the vacuum meters 4, 5 to judge whether or not at least the pressure of the first chamber 1 has reached the predetermined operative pressure Ps. And, if not reached, it continues the decompression in step S1, and if reached, it proceeds to the step S3.

The step S3 is the leaving step. In the step S3, the control section 20 drives the motors 12 to close the four communication valves 8 at the time $t_1$ at which the pressure $P_1$ of the first chamber 1 and the pressure $P_2$ of the second chamber 2 has reached the predetermined operative pressure Ps. Thus, the communication openings 19 are closed to seal the first chamber 1 housing the substrate W. The pressure P1 of the first chamber 1 thus sealed is rising from the operative pressure Ps as illustrated with the chain line shown in FIG. 4 as the evaporation of the solvent of the liquid substance L proceeds. Further, the control section 20 closes the vacuum valve 7 when the second chamber 2 has been decompressed to a target pressure lower than the operative pressure Ps. And then, it proceeds to the step S4.

A step S4 shown in FIG. 3 is a step of judging whether or not the pressure $P_1$ of the first chamber 1 has reached predetermined pressure. In the step S4, as shown in FIG. 4, the control section 20 detects the value of the pressure $P_1$ by the vacuum meter 4. Thus, the pressure difference $\Delta P$ from the operative pressure Ps can be obtained. Since the pressure difference $\Delta P$ depends on the amount evaporation of the solvent (the hatched area in the drawing), the volume (V) of the sealed first chamber 1 is determined assuming that the solvent vapor thus evaporated is an ideal gas under the condition of constant temperature, thus the amount of evaporation (an amount of molecules n) can be obtained by applying the values to the state equation of gas (PV=nRT). Since the amount of liquid substance applied on the substrate W and the content of the solvent are known, the amount of evaporation of the solvent necessary for drying the applied liquid substance can be obtained by calculation. Therefore, the reduced-pressure drying with controlled evaporation amount becomes possible by previously setting the $\Delta P$ corresponding to a predetermined evaporation amount of the solvent considering how much solvent should be evaporated from the liquid substance L in the sealed first chamber 1 with at least one reduced-pressure drying operation. It should be noted that, although the predetermined amount of the solvent, in this case, is assumed to be a constant amount obtained by dividing the whole amount of the solvent included in the liquid substance L by the number of times of the decompression operation, it can appropriately be changed in the repeated steps of the reduced-pressure drying operation.

Such a calculation method for obtaining the evaporation amount is previously input as a program from the input section 24 to be stored in the storage section 23. The operation section 21 executes the program stored in the storage section 23 and displays the evaporation amount of the solvent corresponding to the $\Delta P$ on the display section 25. The control section 20 compares the pressure $P_1$ of the first chamber 1 detected by the vacuum meter 4 with predetermined pressure ($P_s+\Delta P$) to make a judgment. And, if it has reached the predetermined pressure, it proceeds to the step S5. If not, it proceeds to the step S7.

The step S5 shown in FIG. 3 is the communicating step. In the step S5, the control section 20 detects the output of the vacuum mater 4, and drives the motors 12 to open the communication valves 8 when the pressure $P_1$ (or the pressure difference $\Delta P$) has reached a predetermined pressure value, namely at the time $t_2$ when the evaporation amount has reached a predetermined value. Thus, the first and the second chambers 1, 2 are communicated with each other. And then, it proceeds to the step S6.

The step S6 is the discharging step. In the step S6, the control section 20 opens the $N_2$ valve 9 to introduce $N_2$ gas in the first chamber 1 when the second chamber 2 with lower pressure than the operative pressure Ps is communicated with the first chamber 1 so as to prevent the pressure $P_1$ from becoming lower than the operative pressure Ps. The $N_2$ gas thus introduced passes through the vent holes 15a provided to the current plate 15 and flows from the above the substrate W towards the communication openings 19. Thus, the vapor of the solvent evaporated from the liquid substance L is led to the second chamber 2 in conjunction with the flow of the $N_2$ gas. Further, by introducing the $N_2$ gas, it is prevented that the pressure $P_1$ becomes lower than the operative pressure Ps to cause further evaporation of the solvent from the liquid substance L. Namely, the evaporation of the solvent is prevented, and the vapor pressure distribution on the surface of the liquid substance L on the substrate W is kept in a substantially constant state, thus making it possible to discharge the evaporated solvent. In this case, the control section 20 opens the vacuum valve 7 and performs the discharging operation while driving the vacuum pump 6 so as to lower the discharge rate in accordance with the flow rate of the $N_2$ gas. The $N_2$ gas is introduced because if the $N_2$ gas is not introduced when the first and the second chambers 1, 2 are communicated with each other, the pressure $P_1$ becomes lower than the operative pressure Ps causing excessive evaporation of the solvent or bumping thereof.

It should be noted that, as the method of discharging the vapor of the solvent, the introduction of the $N_2$ gas as an inactive gas is not necessary. In the chamber 3 according to the present embodiment, the second chamber 2 is designed to have a larger volume then the first chamber 1. Since the pressure $P_1$ of the first chamber 1, in which the solvent is evaporated from the liquid substance L, becomes higher than the pressure $P_2$ of the second chamber 2, providing the pressure $P_1$ does not become lower than the pressure Ps when communication the first and the second chambers 1, 2 with each other, it is possible to disperse the vapor of the solvent in the second chamber 2 larger in volume and lower in pressure for discharging. Further, it is possible to perform the discharge operation after sealing the first chamber 1 when the vapor of the solvent is dispersed to the second chamber 2, thus equalizing the pressure $P_1$ with the pressure $P_2$. By thus configured, influence of the discharge operation by the vacuum pump 6 can be reduced, and further evaporation of the solvent of the liquid substance L can be prevented, thus maintaining the condition with more event vapor pressure distribution.

Subsequently, the control section 20 closes the $N_2$ valve 9 at a time point $t_3$ when the $N_2$ gas is introduced and the pressure in the chamber 3 has risen. And, it returns to S1 to increase the discharge rate of the vacuum pump 6 again for decompressing the chamber 3 with the first and the second chambers 1, 2 communicated with each other to be the predetermined operative pressure Ps. The subsequent operations are the same as described above, the communication valves 8 are closed to seal the first chamber 1 at a time point $t_4$ when the operative pressure Ps has been reached, and at a time point $t_5$ when the pressure $P_1$ (or the pressure difference $\Delta P$) has reached the predetermined value, the reduced-pressure drying operation of discharging the evaporated vapor of the solvent while introducing the $N_2$ gas is performed. Therefore, the control section 20 repeats the reduced-pressure drying operation from the time to to the time $t_3$ as a cycle until the evaporation of the solvent in the liquid substance L is terminated. As the evaporation of the solvent proceeds, the period of time before the pressure $P_1$ of the sealed first chamber 1 reaches the predetermined pressure ($P_s+\Delta P$) becomes obviously longer. Therefore, in the step S4, if the pressure $P_1$ of the first chamber 1 does not reach the predetermined pressure after a leaving limit time period set in the leaving process (step S3) has elapsed, it proceeds to the step S7.

The step S7 shown in FIG. 3 is the step of judging whether or not the evaporation of the solvent has terminated. In the step S7, the control section 20 accumulates the evaporation amount of the solvent thus evaporated by repeating the reduced-pressure drying operation. The storage section 23 stores the amount M of the solvent according to the composition of the liquid substance L. The control section 20, in comparison between the accumulated evaporation amount N of the solvent and the amount M of the solvent stored in the storage section 23, judges whether or not the evaporation of the solvent has been terminated. In this case, an amount of the solvent evaporated before the operative pressure Ps has been reached need to be considered. Therefore, when the accumulated evaporation amount N becomes 95% of the solvent amount M, it proceeds to a step 8 assuming that the evaporation has been terminated. If it is judged that it has not terminated yet, the leaving step of the step S3 is continued to promote the evaporation. It should be noted that, as the method of judging whether or not the evaporation of the solvent has been terminated, it is possible to stop the discharge operation by the vacuum pump 6 with certain timing in the discharging step, and to obtain the evaporation amount from the pressure values detected by the vacuum meters 4, 5 while stopping to make the judgment based on the evaporation amount.

A step S8 shown in FIG. 3 is the step of releasing the chamber 3 to the atmosphere. In the step S8, the control section 20 stops driving the vacuum pump 6, and opens an air release valve (not shown) of the vacuum pump 6 to introduce the atmospheric air, thereby resetting the second chamber 2 communicated with the first chamber 1 to the atmospheric pressure. Thus, the series of reduced-pressure drying operations are terminated.

Since the time period before the sealed chamber 1 reaches the predetermined pressure ($P_s+\Delta P$) becomes long as the reduced-pressure drying process from the step S1 through the step S6 is repeated, the evaporation rate of the solvent can be lowered. Therefore, in order for more surely evaporate the solvent, the value of the operative pressure Ps can be changed in the processes of the reduced-pressure drying operations repeatedly performed. In the reduced-pressure drying process performed repeatedly, by sealing the first chamber 1 in the condition with the operative pressure Ps reduced from the previous turn or reduced gradually, the evaporation rate of the solvent can be prevented from being lowered. Namely, the evaporation can be promoted with a substantially constant evaporation rate or even with a higher evaporation rate. Or, by sealing the first chamber 1 in the condition with the operative pressure Ps increased from the previous turn or increased gradually, the evaporation rate in the latter reduced-pressure drying operation can lower than the evaporation late in the former operation. Namely, the evaporation can be promoted with the controlled evaporation rate. Therefore, the reduced-pressure drying profile can be modified that, for example, if the accumulated evaporation amount N of the solvent calculated by the operation section 21 is no lower than 90% and no higher than 95% of the solvent amount M, the reduced-pressure drying operation is performed with the operative pressure Ps lower than the previous value so that the accumulated evaporation amount N becomes no less than 95% thereof more quickly.

Further, the setting method of the $\Delta P$ in the reduced-pressure drying operation is as follows. The operation section 21 is capable of calculating the amount of molecules n of the evaporated solvent from the value of $\Delta P$. If the amount of molecules n of the evaporated solvent is estimated, the amount of molecules of the residual solvent in the liquid substance L can be calculated, thus it becomes possible to analyze how the ratio between the solute and the solvent of the liquid substance L varies by the reduced-pressure drying process. The rheologic properties of the liquid substance L described above also vary by the ratio between the solute and the solvent. Therefore, in order for performing the drying operation while reducing changes in the shape of the liquid substance L in the drying process as small as possible, an experiment of the reduced-pressure drying while changing the $\Delta P$ value is previously conducted, and the shapes of the film obtained by the test drying process are studied, it becomes possible to designate the predetermined value of $\Delta P$ capable of obtaining a film having a flat cross-sectional shape with reduced in-plane thickness variation for each cycle of the reduced-pressure drying operation.

Figure 5:
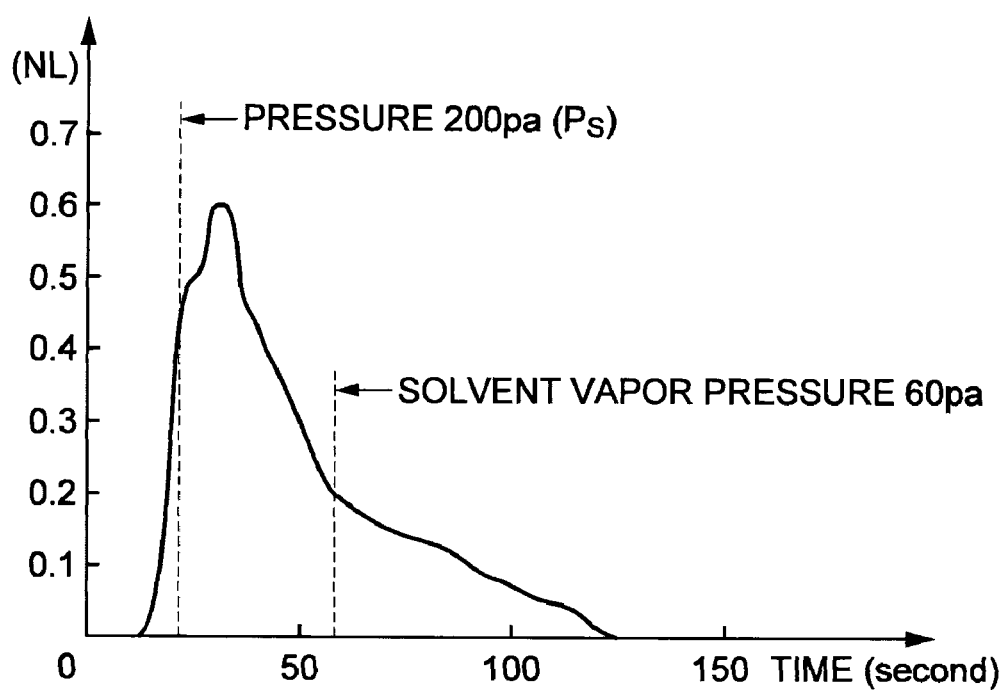
FIG. 5 is a graphic representation of the amount of evaporation of a multi-component liquid substance under the reduced pressure.

The predetermined operative pressure Ps will now be explained. Even if the solvent is composed of a single component, in the liquid substance L under the reduced pressure, the evaporation of the solvent starts before the amount of pressure reduction reaches the vapor pressure (20° C.) of the solvent. If the liquid substance L is of the multi-component, it is predictable that the amount of pressure reduction causing the evaporation of the solvent to start varies by the type or the mixture ratio of the solvent. FIG. 5 is a graphic representation of the amount of evaporation of the multi-component liquid substance under the reduced pressure. For details, it represents the amount of evaporation (NL) under the reduced pressure in the liquid substance L used for forming oriented films 67, 69 (see FIG. 10) of a liquid crystal panel 60 described later, whose vapor pressure (20° C.) is 60 Pa. As the method of investigating the amount of pressure reduction causing the evaporation to start or changes in the amount of evaporation, a weighing instrument (e.g., an electronic balance) capable of measuring the mass of the liquid substance L is disposed in the chamber 3 for weighing appropriate doses of liquid substance L. And, by decompressing the chamber 3 in a substantially constant rate by driving the vacuum pump 6, it is possible to clarify the relationship between the pressure P detected by the vacuum meter 5 and the mass (the amount of evaporation) of the liquid substance L detected by the weighing instrument. If the pressure P is around the vapor pressure of the solvent, there are some cases in which the solvent rapidly evaporates to cause bumping. If bumping is caused, the shape of the liquid substance L is significantly roughened making it difficult to obtain the film having a flat cross-sectional shape after dried. Further, since the bumping occurs anywhere in the surface of the substrate W coated with the liquid substance L, the in-plane film thickness also varies. In order for avoid such a problem, in the reduced-pressure drying method for the liquid substance L including an oriented film forming material, the predetermined operative pressure Ps for making the first and the second chambers 1, 2 in the reduced-pressure state is set to be 200 Ps, which is a little bit lower than the pressure value with which the evaporation of the solvent starts. It should be noted that the unit NL denotes normal litter.

Advantages of the first embodiment described above are as follows.

In the decompressing step (step S1) of the reduced-pressure drying method according to the first embodiment, the control section 20 opens the communication valves 8 to make the first and the second chambers 1, 2 be communicated with each other. And then the control section 20 drives the vacuum pump 6 in this state to decompress the first chamber 1 housing the substrate W coated with the liquid substance L to the predetermined operative pressure Ps. After then, in the leaving step (step S3), the control section 20 closes the communication valves 8 to seal the first chamber 1, thus promoting the evaporation of the solvent in the liquid substance L. And, the first chamber 1 is left until the pressure thereof becomes the predetermined pressure (Ps+$\Delta P$). In the communicating step (step S5), the control section 20 opens the communication valves 8 to communicate the first chamber 1 whose pressure has risen to the predetermined pressure with the second chamber 2. In the discharging step (step S6), the control section 20 controls the discharge rate of the vacuum pump 6 to discharge the vapor of the solvent dispersed in the first and the second chambers 1, 2. Therefore, since the evaporation of the solvent in the liquid substance L proceeds in the first chamber 1 sealed under the predetermined operative pressure Ps, the drying of the liquid substance can be performed without being influenced by the discharge operation of the vacuum pump 6, in the evaporation rate corresponding to the predetermined operative pressure Ps, and also in the condition in which the vapor pressure distribution of the solvent is substantially even throughout the coated surface until the predetermined pressure is reached. Further, since the first and the second chambers 1, 2 are communicated with each other when the pressure of the first chamber 1 reaches the predetermined pressure, namely the pressure higher than the predetermined operative pressure Ps according to the evaporation of the solvent, it becomes possible to disperse the vapor of the solvent in the first chamber 1 to the second chamber with lower pressure and larger capacity to discharge it by the vacuum pump 6. Namely, by setting the predetermined operative pressure Ps and the predetermined pressure in the first chamber 1 in accordance with the type of the liquid substance L to be dried, the evaporation rate of the solvent of the applied liquid substance L can be optimized, thus the reduced-pressure drying method capable of performing the reduced-pressure drying operation in the condition in which the vapor pressure distribution of the solvent is substantially even throughout the coated surface can be provided.

In the reduced-pressure drying method according to the first embodiment described above, the control section 20 repeatedly performs the reduced-pressure drying operation from the decompressing step (step S1) to the discharging step (step S6). Therefore, by evaporating the solvent in stepwise in accordance with the amount of coating (amount of solvent) of the liquid substance L, the reduced-pressure drying method of the liquid substance L capable of forming the smoother film with reduced in-plane thickness variation can be provided.

In the reduced-pressure drying method according to the first embodiment, the predetermined operative pressure Ps is set to be the value higher than the vapor pressure (20° C.) of the liquid substance L and slightly lower than the pressure value with which the solvent starts evaporating. Therefore, the problem that the solvent is rapidly evaporated to roughen the shape of the liquid substance L causing the uneven cross-sectional shape of the dried film can be reduced. Further, the problem that the rapid evaporation of the solvent causes the variation in the in-plane vapor pressure distribution resulting in the variation in the in-plane film thickness of the dried film can also be reduced.

In the reduced-pressure drying method according to the first embodiment, in the discharging step, the control section 20 opens the $N_2$ valve 9 to introduce the $N_2$ gas into the first chamber 1 from the outside so that the first chamber 1 is not decompressed lower than the predetermined operative pressure Ps. Thus, the vapor of the solvent dispersed in the first chamber 1 is led into the second chamber 2 by the $N_2$ gas thus introduced and then discharged by the vacuum pump 6. And, since the surface of the liquid substance L becomes higher than the operative pressure Ps, the evaporation of the residual solvent in the liquid substance L can be prevented. Therefore, since unnecessary evaporation of the solvent is not promoted in the discharging step for discharging the vapor of the solvent, the amount of evaporation of the solvent in accordance with the predetermined pressure (Ps+ΔP) can be controlled to be in the determined state. Namely, by controlling the ratio between the solute and the solvent, the reduced-pressure drying can be performed while preventing the change in the shape of the liquid substance L. Further, if drying is performed while actively discharging the air, the vapor pressure distribution on the substrate W varies, and the in-plane variation might be caused in the shape of the dried liquid substance L. In the discharging step according to the first embodiment, since the evaporation from the liquid substance L is suppressed or stopped when the evaporated solvent is discharged, the reduced-pressure drying method capable of forming the film with the small in-plane variation and stable form can be provided.

Second Embodiment

Figure 6:
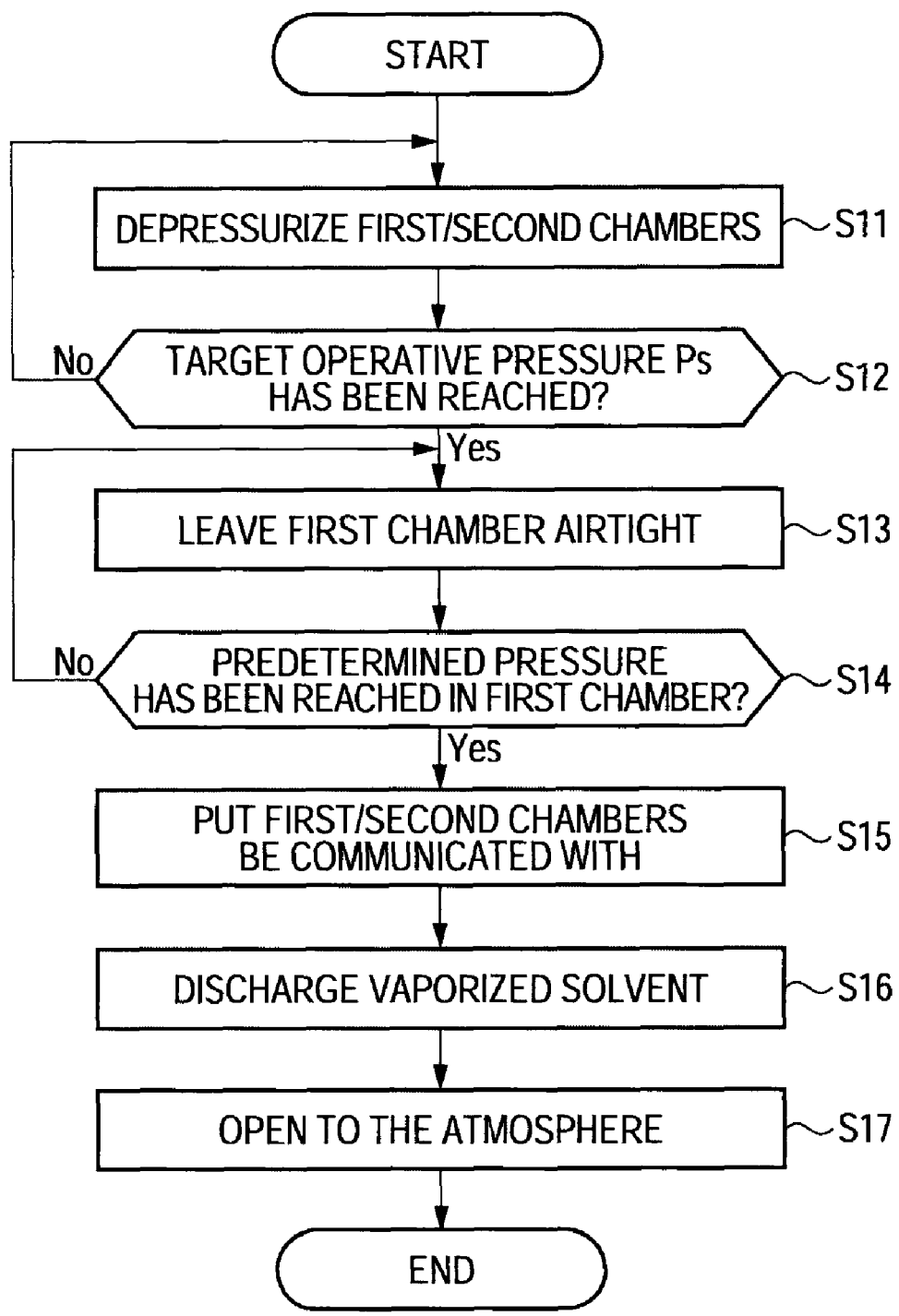
FIG. 6 is a flowchart showing a reduced-pressure drying method according to a second embodiment of the invention.
Figure 7:
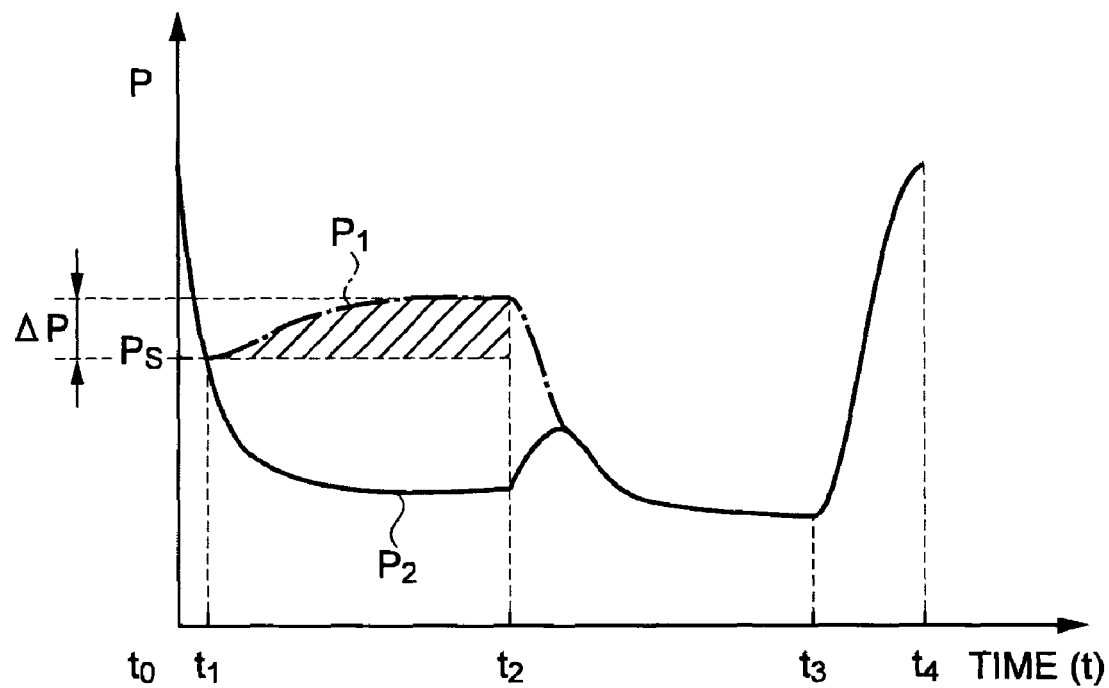
FIG. 7 is a graphic representation of a reduced-pressure drying profile of the reduced-pressure drying device corresponding to the flowchart shown in FIG. 6.

A reduced-pressure drying method according to a second embodiment of the invention will now be explained with reference to FIGS. 6 and 7. FIG. 6 is a flowchart showing a reduced-pressure drying method according to the second embodiment of the invention. FIG. 7 is a graphical representation of the reduced-pressure drying profile of the reduced-pressure drying device. For details, FIG. 7 is a graphical representation of the pressure change in the first and the second chambers 1, 2 with respect to the elapsed time of the reduced-pressure drying corresponding to the flowchart shown in FIG. 6. The vertical axis of the graph is a logarithmic axis representing the pressure P. Further, it shows a shape-control type of reduced-pressure drying method for performing reduced-pressure drying while controlling the shape of the liquid substance L.

Shape Control Type of Reduced-Pressure Drying Method

As shown in FIG. 6, the reduced-pressure drying method according to the second embodiment includes a decompressing step (step S11) for housing the substrate W coated with the liquid substance L in the first chamber 1, and decompressing the first and the second chambers 1, 2 to predetermined operative pressure Ps, with which the solvent is evaporated from the liquid substance L to increase the viscosity thereof to the viscosity right before the viscosity affecting the shape of the film, by the vacuum pump 6 in the condition in which the first and the second chambers are communicated with each other.

Further, there are provided a leaving step (step S13) for leaving the first chamber 1 until the pressure of the first chamber 1 rises to a predetermined value after sealing the first chamber when the pressure of the first chamber reaches the predetermined operative pressure Ps, and a step (step S14) of judging whether of not the pressure $P_1$ of the sealed first chamber 1 reaches the predetermined pressure. Further, there are provided a communicating step (step S15) for communicating the first chamber 1 whose pressure has risen to the predetermined pressure with the second chambers 2, and a discharging step (step S16) for discharging the vapor of the solvent dispersed in the first and the second chambers 1, 2 with the vacuum pump 6. The predetermined pressure in the present embodiment is set to the pressure obtained by adding the operative pressure Ps to the saturated vapor pressure Psa of the solvent in the sealed first chamber 1.

The step S11 shown in FIG. 6 is the decompressing step. In the step S11, the substrate W coated with the liquid substance L is mounted on the mounting stage 11 in the first chamber 1, and airtightly housed in the chamber 3 by closing the door. The control section 20 confirms whether or not the $N_2$ valve 9 is closed, and if closed, it drives the motors 12 to open the four communication valves 8 to form the condition in which the first and the second chambers 1, 2 are communicated with each other through the communication openings 19. Then, as shown in FIG. 7, it opens the vacuum valve 7 and drives the vacuum pump 6 to start (time $t_0$) the decompression for reducing the pressure $P_1$ of the first chamber 1 and the pressure $P_2$ of the second chamber 2 so as to reach the predetermined operative pressure Ps. And then, it proceeds to the step S12.

A step S12 shown in FIG. 6 is a step of judging whether or not the pressure $P_1$ of the first chamber 1 and the pressure $P_2$ of the second chamber 2 reach the target operative pressure Ps. In the step S12, the operative pressure Ps is set to the value with which most of the solvent is evaporated from the liquid substance L to increase the viscosity of the liquid substance L to the viscosity right before the viscosity affecting the shape of the film. The control section 20 detects the outputs from the vacuum meters 4, 5 to judge whether or not at least the pressure of the first chamber 1 has reached the predetermined operative pressure Ps. And, if it judges that it has not reached, it continues the decompression in step S11, and if it judges that it has reached, it proceeds to the step S13.

The step S13 shown in FIG. 6 is the leaving step. In the step S13, the control section 20 drives the motors 12 to close the four communication valves 8 at the time $t_1$ at which the pressure $P_1$ of the first chamber 1 and the pressure $P_2$ of the second chamber 2 has reached the predetermined operative pressure Ps. Thus, the communication openings 19 are closed to seal the first chamber 1 housing the substrate W. The pressure $P_1$ of the first chamber 1 is rising from the operative pressure Ps in accordance with proceeding of the evaporation of the solvent in the liquid substance L as illustrated with the chain line of the graph shown in FIG. 7 with the liquid substance L having viscosity increased to the viscosity right before the viscosity affecting the shape of the film. Namely, the reduced-pressure drying process in the range of viscosity (the ratio between the solute and the solvent) determining the shape of the film proceeds in a very slow evaporation rate of the solvent. Further, the control section 20 closes the vacuum valve 7 when the second chamber 2 has been decompressed to a target pressure lower than the operative pressure Ps. And then, it proceeds to the step S14.

The step S14 shown in FIG. 6 is the step of judging whether or not the pressure $P_1$ of the first chamber 1 has reached predetermined pressure. In the step S14, as shown in FIG. 7, the control section 20 detects the value of the pressure $P_1$ by the vacuum meter 4. By leaving the first chamber 1 in the sealed condition, the evaporation of the solvent proceeds to raise the pressure $P_1$, and the liquid substance L and the evaporated solution vapor eventually make an equilibrium state, and rise of the pressure $P_1$ is stopped and stabilized. Thus, the pressure difference $\Delta P$ from the operative pressure Ps can be obtained. At this moment, it is judged that the evaporation of the solvent in the liquid substance L in the sealed first chamber 1 has reached the saturated state. The saturated vapor pressure Psa of the solvent can be obtained by calculation since the volume of the first chamber 1 is known. In this case, the control section 20, assuming that the predetermined pressure is the sum of the operative pressure Ps and the saturated vapor pressure Psa, compares the predetermined pressure with the stabilized pressure $P_1$ to judge whether or not the predetermined pressure has been reached or not. And, if it is judged that the predetermined pressure has been reached, it proceeds to the step S15. If it is judged that it has not been reached, it proceeds to the step S13 to keep the sealed state of the first chamber. It should be noted that in this case the pressure $P_1$ does not need to be the sum of the operative pressure Ps and the saturated vapor pressure Psa in a strict sense. If it is substantially the saturated vapor pressure, it is judged as in the equilibrium state. Further, $\Delta P$ can be compared with the saturated vapor pressure Psa.

In the steps S13 through S14, since the first chamber 1 is left until the saturated state has been reached, very slow reduced-pressure drying process is executed on the liquid substance L. Namely, the ratio between the solute and the solvent is changed slowly, and the liquid substance L is dried while the liquidity of the liquid substance L is suppressed, and therefore the film can be formed in the condition in which the cross-sectional shape of the dried film is flat, and the in-plane film thickness variation is smaller.

The step S15 shown in FIG. 6 is the communicating step. In the step S15, the control section 20 detects the output of the vacuum meter 4, and drives the motors 12 to open the communication valves 8 at the time $t_2$ when the pressure $P_1$ reaches the predetermined pressure as shown in FIG. 7. And then, it proceeds to the step S16.

The step S16 shown in FIG. 6 is the discharging step. In the step S16, the control section 20 opens the $N_2$ valve 9 to introduce the $N_2$ gas into the first chamber 1 in order for introducing the vapor of the solvent in the first chamber 1 to the second chamber 2 when the second chamber 2, whose pressure is lower than the operative pressure Ps, is communicated with the first chamber 1. The $N_2$ gas thus introduced passes through the vent holes 15a provided to the current plate 15 and flows from the above the substrate W towards the communication openings 19. Therefore, the vapor of the solvent evaporated from the liquid substance L is discharged to the second chamber 2 in conjunction with the flow of the $N_2$ gas. In this case, the control section 20 performs the discharge operation by opening the vacuum valve 7 and, at the same time, controlling the vacuum pump 6 so that the discharge rate is increased in accordance with the flow of the $N_2$ gas. The liquid substance L is processed with the reduced-pressure drying process in the leaving step of step S13 at a very slow evaporation rate, and at this moment, is increased in the viscosity in the condition in which the film shape thereof is stable without depending on the following drying process. Therefore, in the later process, it is dried by performing an active discharge process for reducing the pressure $P_1$ in the chamber 3 to be lower than the operative pressure Ps so that the residual solvent in the liquid substance L is extracted. The discharge rate and the decompression time of the active discharge process is previously input from the input section 24 as the data of the reduced-pressure drying profile to be stored in the storage section 23. The control section 20 detects the elapsed time measured by the timer 22 and drives the vacuum pump 6 based on the designated discharge rate and the decompression time. It should be noted that, in this case, since the pressure $P_2$ is lower than the pressure $P_1$, the vapor of the solvent evaporated in the first chamber 1 could be dispersed to the second chamber 2 having a larger volume for discharging without introducing the $N_2$ gas. Further, the first chamber 1 can be sealed when the vapor of the solvent is dispersed in the second chamber 2. Accordingly, in the case in which the drying of the liquid substance L is not sufficient at this moment and the reduced-pressure drying operation is performed again, the influence of the discharge operation by the vacuum pump 6 can be prevented. Further, as the method of judging whether or not the active discharging should be terminated, it is possible to stop the discharge operation by the vacuum pump 6 with certain timing in the discharging step, and to obtain the evaporation amount from the pressure values detected by the vacuum meters 4, 5 while stopping to make the judgment based on the evaporation amount. And then, it proceeds to the step S17.

A step S17 shown in FIG. 6 is a step of releasing the chamber 3 to the atmosphere. In step S17, the control section 20 closes the $N_2$ valve 9 and stops driving the vacuum pump 6 at $t_3$ when the active discharge is terminated. And then, the control section 20 opens the air release valve (not shown) of the vacuum pump 6 to introduce the atmospheric air, thereby resetting the second chamber 2 communicated with the first chamber 1 to the atmospheric pressure ($t_4$). Thus, the series of reduced-pressure drying operations are terminated.

It should be noted that the amount M of the solvent varies by the type of the liquid substance L or the amount thereof applied thereon. Further, the capacity of the first chamber 1 is a fixed value. Therefore, since the evaporation amount (corresponding to the hatched area in the drawing) of the solvent in the saturated state depends on the capacity of the first chamber, it is possible that the drying of the liquid substance L is not necessarily completed with a single reduced-pressure drying operation. Therefore, the reduced-pressure drying profile can be set so that the decompressing step through the discharging step are repeatedly performed. Further, in this case, the pressure of the chamber 3 in the discharging step is preferably set similarly to the first embodiment, namely the pressure $P_1$ is preferably set higher than the operative pressure Ps in discharging operation.

Advantages of the second embodiment described above are as follows.

In the decompressing step (step S11) of the reduced-pressure drying method according to the second embodiment, the control section 20 opens the communication valves 8 to make the first and the second chambers 1, 2 be communicated with each other. And then the control section 20 drives the vacuum pump 6 in this state to decompress the first chamber 1 housing the substrate W coated with the liquid substance L to the predetermined operative pressure Ps, with which the solvent is evaporated from the liquid substance L to increase the viscosity thereof to the viscosity right before the viscosity affecting the shape of the film. After then, in the leaving step (step S13), the control section 20 closes the communication valves 8 to seal the first chamber 1, thus promoting the evaporation of the solvent in the liquid substance L. And, the first chamber 1 is left until the pressure $P_1$ thereof becomes the predetermined pressure (operative pressure Ps+saturated pressure Psa). In the communicating step (step S15), the control section 20 opens the communication valves 8 to communicate the first chamber 1 whose pressure has reached the predetermined pressure with the second chamber 2. In the discharge step (step S16), the control section 20 opens the N$_2$ valve 9 to introduce N$_2$ gas, thereby discharging the vapor of the solvent from the first chamber 1 to the second chamber 2. At the same time, the control section 20 increases the discharge rate of the vacuum pump 6 to perform the active discharge, thereby making the residual solvent in the liquid substance L evaporate and discharging it. Therefore, it is possible to provide a very slow drying condition (evaporation rate) in which the drying process proceeds only by dispersion of the vapor until the saturated vapor pressure is reached without being affected by the discharging operation of the vacuum pump 6. Further, since the drying process proceeds in the sealed first chamber 1 in a condition in which the vapor pressure distribution is even throughout the surface, the in-plane evenness of the film shape can be improved. Further, since the liquid substance L is left with a stable film shape derived from the increased viscosity, the active discharge process for extracting the residual solvent can be performed. Namely, the reduced-pressure drying method for performing drying operation while controlling the shape of the liquid substance L under the reduced pressure can be provided.

Third Embodiment

Figure 8:
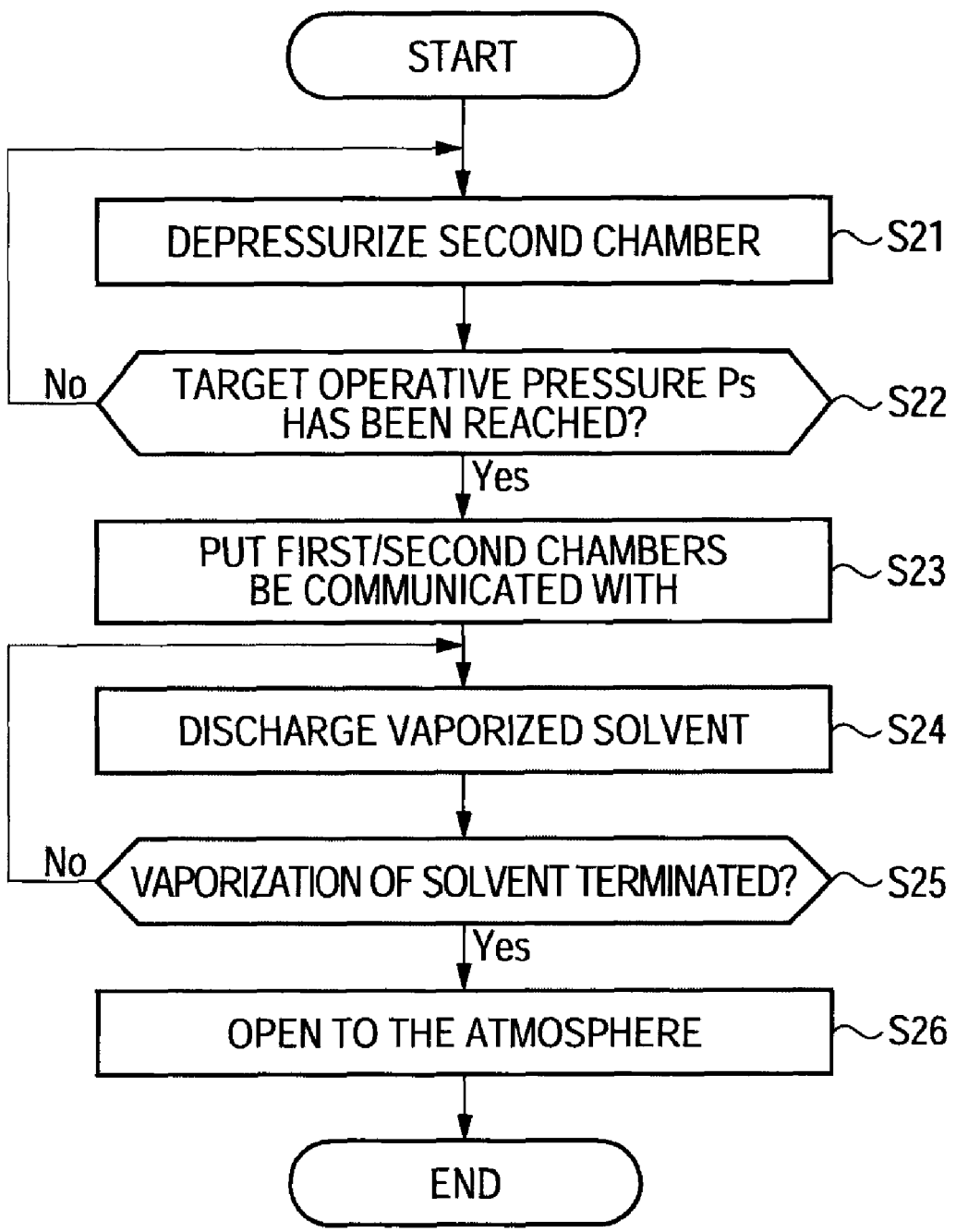
FIG. 8 is a flowchart showing a reduced-pressure drying method according to a third embodiment of the invention.
Figure 9:
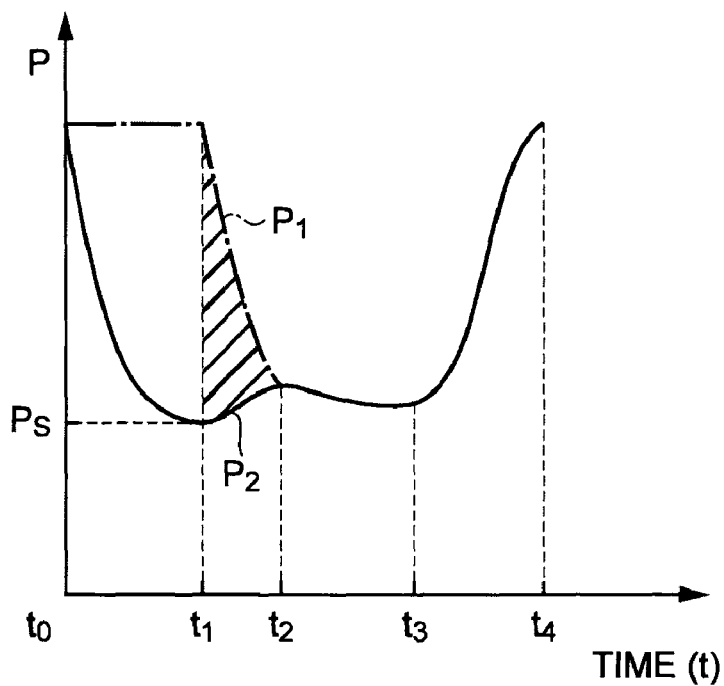
FIG. 9 is a graphic representation of a reduced-pressure drying profile of the reduced-pressure drying device corresponding to the flowchart shown in FIG. 8.

A reduced-pressure drying method according to a third embodiment of the invention will now be explained with reference to FIGS. 8 and 9. FIG. 8 is a flowchart showing a reduced-pressure drying method according to the third embodiment of the invention. FIG. 9 is a graphical representation of the reduced-pressure drying profile of the reduced-pressure drying device. For details, FIG. 9 is a graphical representation of the pressure change in the first and the second chambers 1, 2 with respect to the elapsed time of the reduced-pressure drying corresponding to the flowchart shown in FIG. 8. Further, it shows a rapid drying type of reduced-pressure drying method.

Rapid Drying Type of Reduced-Pressure Drying Method

As shown in FIG. 8, the reduced-pressure drying method according to the third embodiment includes a decompressing step (step S21) for decompressing the second chamber 2 not communicated with the first chamber 1 housing the substrate W in a substantially airtight condition by the vacuum pump 6, a communicating step (step S23) for communicating the first and the second chambers 1, 2 with each other in the state in which the second chamber 2 has reached the predetermined operative pressure Ps, and a discharging step (step S24) for discharging the vapor of the solvent dispersed in the first and the second chambers 1, 2.

The step S21 shown in FIG. 8 is the decompressing step. In the step S21, the controller 20 drives the motors 12 to close the communication valves 8, thereby sealing the first chamber 1 housing the substrate W coated with the liquid substance L. And then, the control section 20 drives the vacuum pump 6 to decompress the second chamber 2 so that the pressure P$_2$ of the second chamber 2 becomes the predetermined operative pressure Ps. The predetermined operative pressure Ps in the present embodiment is set to be higher than the vapor pressure of the solvent of the liquid substance. And then, it proceeds to the step S22.

A step S22 is a step of judging whether or not the pressure P$_2$ of the second chamber 2 has reached the target operative pressure Ps. In the step S22, the control section 20 judges whether or not the pressure P$_2$ of the second chamber 2 has reached the operative pressure Ps based on the detection signal input from the vacuum meter 5. And, if it judges that it has not reached, it continues the decompression in step S21, and if it judges that it has reached, it proceeds to the step S23.

The step S23 is the communicating step. In step S23, as shown in FIG. 9, the control section 20 drives the motors 12 to open the communication valves 8 to communicate the first chamber 1 with the second chamber 2 at the time t$_1$ when the pressure of the second chamber 2 has reached the operative pressure Ps. The pressure P$_1$ of the first chamber 1 communicated with the second chamber 2 is rapidly reduced from substantially the atmospheric pressure towards the pressure P$_2$ of the second chamber 2. Namely, the period between the time t$_1$ and the time t$_2$ corresponds to the rapid decompression process of the first chamber 1. And then, it proceeds to the step S24.

The step S24 shown in FIG. 8 is the discharging step. In the step S24, as shown in FIG. 9, in the period between the time t1 and the time t2, the control section 20 continues driving the vacuum pump 6 to discharge the vapor (the amount of the vapor corresponds to the hatched area in the drawing) of the solvent evaporated from the liquid substance L. Subsequently, at the time t$_2$, the control section 20 opens the N$_2$ valve 9 to introduce the N$_2$ gas in the first chamber 1 to eject the vapor of the solvent. In this case, in order to make the reduced-pressure drying profile optimum, the control section 20 increases the discharge rate of the vacuum pump 6 in accordance with the flow of the N$_2$ gas, and opens or closes the vacuum valve and the N$_2$ valve based on the detection result of the vacuum maters 4, 5, thereby providing a desired reduced-pressure drying profile. For example, in the case in which the pressure of the chamber 3 is increased by the evaporation of the solvent higher than the target pressure, it opens the vacuum valve 7 to perform discharge. Further, in the case in which the evaporation amount of the solvent decreases and accordingly the pressure in the chamber 3 becomes lower than the target pressure, the control section 20 closes the vacuum valve 7 and opens the N$_2$ valve to introduce the N$_2$ gas, thereby returning the pressure to the target pressure. The target pressure is, as shown in FIG. 9, preferably set to substantially the same level as the operative pressure Ps. Thus, the bumping of the solvent can be prevented. Namely, the in-plane variation of the film shape caused by the bumping can be reduced. And then, it proceeds to the step S25.

The step S25 shown in FIG. 8 is the step of judging whether or not the evaporation of the solvent has terminated. In step S25, the reduced-pressure drying profile is controlled based on, for example, the data of pressure in the chamber 3 and the time, the time point in the active evacuating profile when a predetermined amount of time has elapsed is judged as the time point of termination of evaporation of the solvent. Further, under the condition with the vacuum valve 7 closed, for example, the time point when detection of increase in pressure has stopped is judged as the time point of termination of evaporation of the solvent. If it judges that the evaporation of the solvent is not yet terminated, it returns to step S24 to continue the discharging step. If it judges the termination, it proceeds to step S26. It should be noted that, as the method of judging whether or not the evaporation of the solvent has been terminated, it is possible to stop the discharge operation by the vacuum pump 6 with certain timing in the discharging step, and to obtain the evaporation amount from the pressure values detected by the vacuum meters 4, 5 while stopping to make the judgment based on the evaporation amount.

A step S26 shown in FIG. 8 is a step of releasing the chamber 3 to the atmosphere. In the step S26, at the time t$_3$ when it is judged that the evaporation of the solvent has terminated, as shown in FIG. 9, the control section 20 stops driving the vacuum pump 6, and opens the air release valve (not shown) of the vacuum pump 6 to introduce the atmospheric air, thereby resetting the second chamber 2 communicated with the first chamber 1 to the atmospheric pressure. Thus, the series of reduced-pressure drying operations are terminated.

The rapid drying type of reduced-pressure drying method described above is used in the case in which a liquid substance L having a solvent with relatively high vapor pressure compared to those applying the reduced-pressure drying method according to the first or the second embodiment is used, and accordingly, a great deal of solvent is evaporated before the operative pressure Ps has been reached. In such a liquid substance L, the decompressing process performed until the ratio between the solute and the solvent reaches to be able to fix the film shape needs to be controlled. Since the liquid substance L in the first chamber 1 is exposed under the pressure reduced at once to the predetermined operative pressure Ps without going through the decompressing process, the reduced-pressure drying can be performed within a range of the ratio between the solute and the solvent capable of stabilizing the film shape while eliminating the decompressing process in which gradient in shape is apt to be caused by the variation in the ratio between the solute and the solvent.

It should be noted that in the reduced-pressure drying method described above, the volume of the second chamber 2 is preferably set sufficiently larger than the volume of the first chamber 1 in the reduced-pressure drying device 10. According to this setting, it becomes possible to rapidly decompress the first chamber 1 by communicating the first and the second chambers 1,2 with each other. Namely, since the liquid substance L can rapidly be exposed under the reduced pressure, the influence of the decompressing process to the film shape can further be reduced.

Advantages of the third embodiment described above are as follows.

In the reduced-pressure drying method according to the third embodiment, the control section 20 drives the vacuum pump 6 to decompress the second chamber 2 to the operative pressure Ps while the communication valves 8 is closed and the first and the second chambers 1, 2 are not communicated with each other in the decompressing step (step S21). Subsequently, in the communicating step (step S23), the control section 20 opens the communication valves 8 to communicate the second chamber 2 whose pressure has reached the operative pressure Ps with the first chamber 1 in substantially the atmospheric pressure. In the discharging step (step S24), the control section 20 continuously drives the vacuum pump 6 to discharge the vapor of the solvent evaporated from the liquid substance L. Subsequently, the control section 20 performs the reduced-pressure drying profile for tracing the predetermined target pressure by opening and closing the vacuum valve 7 and the $N_2$ valve 9, thereby promoting the evaporation of the solvent. Therefore, since the liquid substance L in the first chamber 1 is exposed under the pressure reduced at once to the predetermined operative pressure Ps without going through the decompressing process, the rapid drying type of reduced-pressure drying method for performing drying under the reduced pressure within a range of the ratio between the solute and the solvent capable of stabilizing the film shape while eliminating the decompressing process in which gradient in shape is apt to be caused by the variation in the ratio between the solute and the solvent can be provided.

In the reduced-pressure drying method according to the third embodiment, the predetermined operative pressure Ps is set to be higher than the vapor pressure of the solvent of the liquid substance. Accordingly, the rapid bumping of the solvent can be prevented, thereby reducing the in-plane variation of the film shape after drying caused by the bumping.

Now, a method of manufacturing a functional film, an electro-optic device, and a method of manufacturing the electro-optic device applying the reduced-pressure drying method according to the invention will be explained taking a liquid crystal display device and an organic EL display device as examples.

Fourth Embodiment

Liquid Crystal Display Device and Manufacturing Method Thereof

Figure 10:
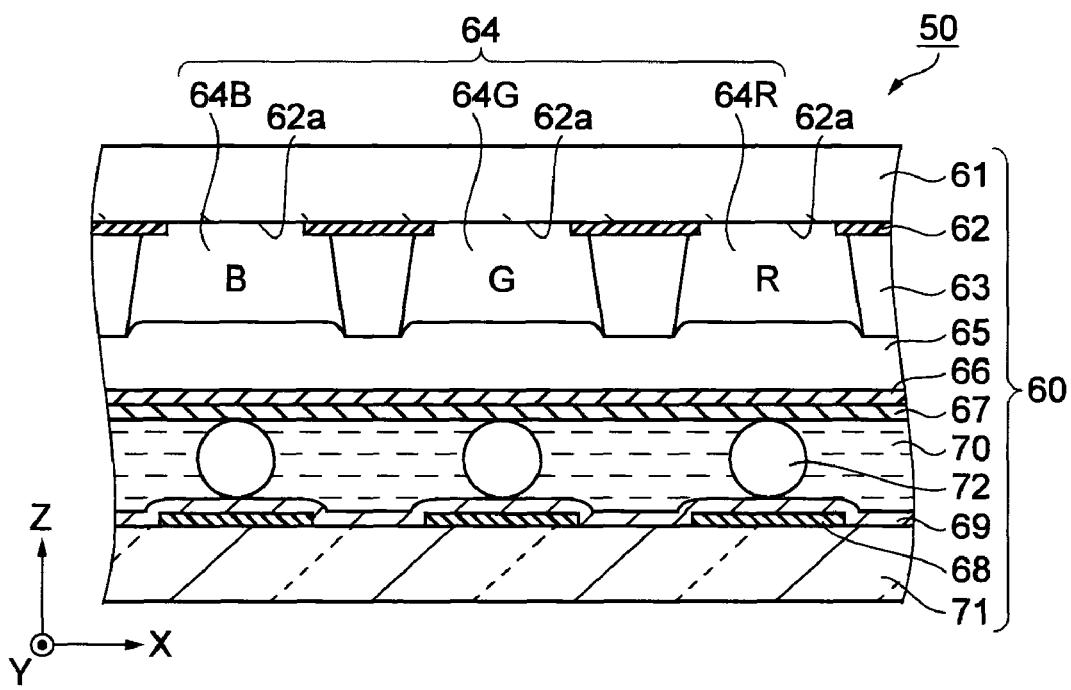
FIG. 10 is a schematic cross-sectional view showing a relevant part of the structure of a liquid crystal display device according to an embodiment of the invention.

FIG. 10 is a schematic cross-sectional view showing a structure of a relevant part of a liquid crystal display device. As shown in FIG. 10, a liquid crystal device 50 is a passive matrix type of liquid crystal display device including a liquid crystal display panel 60 provided with a color filter substrate (CF substrate) 61 having a plurality of color layers 64, an opposing substrate 71 having a plurality of electrodes 68, and liquid crystal 70 held between the CF substrate 61 and the opposing substrate 71. The liquid crystal display device 50 as described above, which is a passive type of display device, is equipped with a lighting device (not shown) having a light source such as LED elements, EL, or a cold-cathode tube at a back side of the opposing substrate 71, for example. It should be noted that the liquid crystal display device 50 according to the present embodiment is not limited to the present device, but can be an active matrix type of liquid crystal display device equipped with switching devices such as thin film transistors (TFT) or thin film diodes (TFD) in the opposing substrate 71.

The opposing substrate 71 is made of, for example, transparent resin of transparent glass, and provided with a plurality of electrodes 68 made of indium tin oxide (ITO) on the surface at the side of the liquid crystal 70. The electrodes 68 extends in a Y direction perpendicular to transparent electrodes 66 made of ITO and provided to the CF substrate 61 opposing thereto. Namely, the liquid crystal panel 60 is provided with the electrodes 66 and the electrodes 68 disposed so as to face each other and are perpendicular to each other to form a lattice shape. And, the intersections of the electrodes 66 and the electrodes 68 overlapped perpendicularly to each other are defined as pixel areas for display. Each of the electrodes 66, 68 is formed by etching films to desired shapes after forming the films by a sputtering process using ITO as the target material.

The CF substrate 61 is formed of, for example, a transparent resin substrate or a transparent glass substrate, and is provided with, on the surface thereof, a light blocking film 62 as a lower layer bank having openings corresponding to the color element areas and a upper layer bank 63 disposed on the light blocking film 62. Further, in the color element areas partitioned by the upper layer bank 63, there are provided color layers 64 as color elements corresponding to red (R), green (G), and blue (B), respectively, and a overcoat (OC) layer 65 as a planarization layer covering the color layers 64 and the upper layer bank 63. The electrodes 66 are formed on the OC layer 65.

As a material of the light blocking film 62, for example, opaque metals such as Cr, Ni, and Al, or chemical compounds such as oxides of these metals can be used. As a method of formation, a vapor deposition method or a sputtering method can be used for forming the film made of the material described above on the CF substrate 61. The film thickness needs to be determined to the thickness capable of maintaining the light blocking property in accordance with the selected material. For example, if Cr is selected, 100 through 200 nm is preferable. And, the film is covered with a resist film except the areas corresponding to the opening sections 62a by a photolithography method, and then the film is etched using an etching liquid such as an acid suitable for each of the above materials. Thus, the light blocking film 62 having opening sections 62a can be formed.

Regarding the upper layer bank 63, an acrylic photosensitive resin material is applied by a roll coat method or a spin coat method on the surface of the CF substrate provided with the light blocking film 62 formed thereon, and dried to form a photosensitive resin layer with a thickness of about 2 μm. And, after a mask provided with openings having a size corresponding to the color element areas is opposed to the CF substrate 61 in a predetermined position, an exposure process and a developing process are performed to form the upper layer bank 63.

The color layer 64 as a functional film is formed by applying three kinds (three colors) of functional liquid (liquid substance) including color layer forming material to the color element areas substantially partitioned by the upper layer bank 63, and finally formed as a film using the reduced-pressure drying method according to either one of first through third embodiments. Since the amount of solvent contained in the functional liquid is relatively large, the reduced-pressure drying method according to the first embodiment is preferably used. And, the color layers 64 of the same color are arranged in the Y-axis direction, and the color layers 64 of different colors are arranged in the X-axis direction in parallel to each other. A so-called stripe type of color filter is provided. As a method of applying the three colored functional liquids, a droplet ejection method for applying each of the functional liquids to the color element areas as a droplet is used.

As the OC layer 65, a transparent acrylic resin material can be used. As a manufacturing method thereof, a spin coat method, an offset printing method and so on can be cited. The OC layer 65 is provided for reducing unevenness of the surface of the CF substrate 61 provided with color layer 64 formed thereon to planarize the electrodes 66 to be formed on the surface later. Further, in order for ensuring adhesiveness with the electrodes 66, it is possible to form a thin film of $SiO_2$, for example, on the OC layer 65.

The liquid crystal display panel 60 is formed by disposing the CF substrate 61 described above and the opposing substrate 71 so as to face each other via a gap member 72 with a predetermined distance, and bonding them using seal member not shown in the drawings. Further, the liquid crystal 70 is sealed between the two substrates 61, 71 using the seal member. On the sides of the two substrates 61, 71 facing the liquid crystal 70, there are provided oriented films 67, 79, respectively, for making the liquid crystal 70 be oriented in a predetermine direction. Such oriented films 67, 69 as functional films are formed by applying a functional liquid (liquid substance) including, for example, polyimide resin as an oriented film forming material, and formed as a film using the reduced-pressure drying method according to either one of the first through third embodiments described above. The thickness of dried oriented films 67, 69 is about several hundred angstrom, and the amount of solvent included in the functional liquid is relatively small compared to the case with forming the color layer 64. Therefore, the reduced-pressure drying method according to the second embodiment is preferably used.

Further, although on each of the front side and the back side surfaces of the liquid crystal panel 60, there is usually provided a polarization plate for polarizing inputting or outputting light, a retardation film as an optical functional film for improving the field angle, and so on, these elements are omitted here.

Advantages of the fourth embodiment described above are as follows.

In the liquid crystal display device 50 according to the fourth embodiment, in the method of manufacturing the color layers 64 as the functional films, the three kinds of functional liquids including color layer forming materials are applied to the color element areas and formed as films using the reduced-pressure drying method according to either one of the first through third embodiments described above. Accordingly, the evaporation rate of the solvent in the functional liquid is optimized under the reduced pressure, and the reduced-pressure drying process is performed in a condition in which the in-plane vapor pressure distribution is substantially even. Therefore, the color layers 64R, 64G, and 64B each having a substantially flat cross-sectional shape and small in-plane thickness variation can be formed.

In the liquid crystal display device 50 according to the fourth embodiment, in the method of manufacturing the oriented films 67, 69 as the functional films, the functional liquid including the oriented film forming material is applied and formed as films using the reduced-pressure drying method according to either one of the first through third embodiments described above. Accordingly, the evaporation rate of the solvent in the functional liquid is optimized under the reduced pressure, and the reduced-pressure drying process is performed in a condition in which the in-plane vapor pressure distribution is substantially even. Therefore, the oriented films 67, 69 each having a substantially flat cross-sectional shape and small in-plane thickness variation can be formed.

In the method of manufacturing the liquid crystal display device 50 according to the fourth embodiment, the color layers 64 and the oriented films 67, 69 are manufactured using the method of manufacturing a functional film using the reduced-pressure drying method according to either one of the first through third embodiments. Therefore, the liquid crystal display device 50 including the liquid crystal display panel 60 having the color layers 64R, 64G, and 64B and the oriented films 67, 69 each having a substantially flat cross-sectional shape and small in-plane thickness variation can be manufactured.

The liquid crystal display device 50 according to the fourth embodiment is manufactured using the manufacturing method of a functional film using the reduced-pressure drying method according to either one of the first through third embodiments, and is equipped with the liquid crystal display panel 60 including the color layers 64R, 64G, and 64B and the oriented films 67, 69 each having a substantially flat cross-sectional shape and small in-plane thickness variation. Therefore, the liquid crystal display device 50 having a high display quality with little display variations such as color variations in the color layers 64 or orientation variations in the oriented films 67, 69 can be provided.

Fifth Embodiment

Organic EL Display Device and Manufacturing Method Thereof

Figure 11:
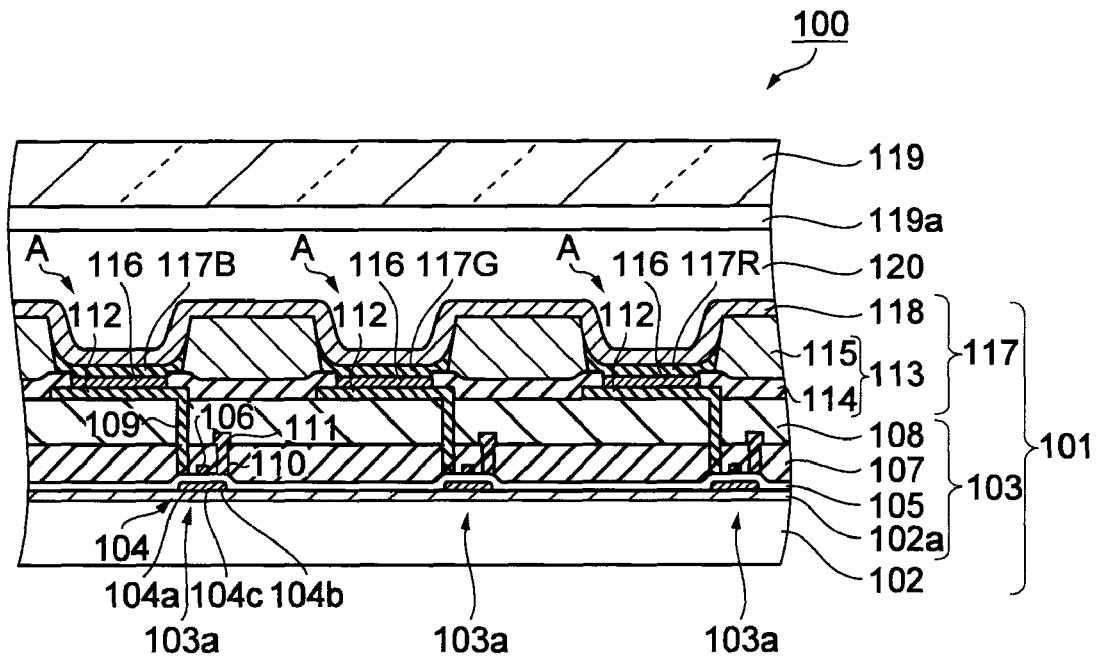
FIG. 11 is a schematic cross-sectional view showing a relevant part of the structure of an organic EL display device according to an embodiment of the invention.

FIG. 11 is a schematic cross-sectional view showing a relevant part of the structure of an organic EL display device according to an embodiment of the invention. As shown in FIG. 11, the organic EL display device 100 is provided with a substrate 101 having light emitting element section 117, and a sealing substrate 119 airtightly attached to the substrate 101 with a space 120 therebetween. Further, the substrate 101 is provided with a circuit element section 103 on an element substrate 102, and the light emitting element section 117 is formed overlapping on the circuit element section 103 to be driven by the circuit element section 103. In the light emitting element section 117, there are formed three colored light emitting layers 117R, 117G, and 117B in the respective color element areas A to form a stripe. The substrate 101 is provided with pixels disposed in a matrix on the circuit element section 103 of the element substrate 102, each of the pixels including three color element areas respectively corresponding to three colored light emitting layers 117R, 117G, and 117B. In the organic EL display device 100 according to the present embodiment, the light emitted from the light emitting element section 117 is output to the side of the element substrate 102.

The sealing substrate 119 is made of glass or metal, and is bonded to the substrate 101 via sealing resin, and provided with a getter material 119a adhered on a surface inside the sealed area. The getter material 119a is for absorbing water or oxygen entering the space 120 between the substrate 101 and the sealing substrate 119 to prevent deterioration of the light emitting element section 117 caused by the water or the oxygen entering the space. It should be noted that the getter material 119a could be omitted.

The substrate 101 has a plurality of color element areas A on the circuit element section 103 of the element substrate 102, and is provided with a two-layer bank 113 as a bank for partitioning the plurality of color element areas A and has a step on the wall face, electrodes 112 provided to the plurality of color element areas A, and hole injection transport layers 116 stacked on the electrodes 112. Further, it is also provided with the light emitting element section 117 including light emitting layers 117R, 117G, and 117B formed by respectively applying three kinds of functional liquid (liquid substance) including light emitting layer forming materials in the plurality of color element areas A.

The two-layer bank 113 is composed of a lower layer bank 114 and a upper layer bank 115 for substantively partitioning the color element areas A, and the lower layer bank 114 is provided so as to protrude inside the color element areas A to form a step in the wall face of the two-layer bank.

As a method of forming the lower layer bank 114 the following can be cited as an example. Namely, a surface of each of the electrodes 112 is masked using a resist or the like in accordance with each of the light emitting layers 117R, 117G, and 117B to be formed later. And, the element substrate 102 provided with the mask is set in the vacuum device to perform sputtering of vapor deposition using SiO$_2$ as the target or the material, thereby forming the lower layer bank 114. The masking material such as resist is removed later. It should be noted that since the lower layer bank 114 is made of SiO$_2$, which has sufficient transparency with a thickness no larger than 200 nm, it does not give any harmful influence to light emission even with the hole injection transportation layer 116 and the each of the light emitting layers 117R, 117G, and 117B to be stacked thereon later.

As a method of forming the upper layer bank 115, the following can be cited as an example. Namely, an acrylic photosensitive resin material is applied by a roll coat method or a spin coat method on the surface of the element substrate provided with the lower layer bank 114 formed thereon, and dried to form a photosensitive resin layer with a thickness of about 2 μm. And, after a mask provided with openings with sizes corresponding to the color element areas A is opposed to the element substrate 102 in a predetermined position, an exposure process and a developing process are performed to form the upper layer bank 115.

Regarding a method of forming the each of the light emitting layers 117R, 117G, and 117B as functional layers, the three kinds of functional liquids (liquid substances) including the light emitting layer forming materials are applied to the color element areas A substantively partitioned by the upper layer bank 115 using the droplet ejection method, and then dried under reduced pressure using the reduced-pressure drying method according to either one of the first through the third embodiments to be formed as a film. Therefore, each of the light emitting layers 117R, 117G, and 117B having a substantially flat cross-sectional shape and little in-plane thickness variation is provided to the substrate 101.

The element substrate 102 is formed of a transparent substrate such as a glass substrate, and is provided with a base protective film 102a formed of a silicon oxide film formed thereon. On the base protective film 102a, there are formed discrete semiconductor films 104 made of polycrystal silicon. It should be noted that the source region 104a and the drain region 104b are formed on each of the semiconductor films 104 by high concentration P ion implantation. Further, portions where P is not introduced become channel regions 104c. Further, a transparent gate insulating film 105 covering the base protective layer 102a and the semiconductor films 104 is formed, and gate electrodes 106 made of Al, Mo, Ta, Ti, W, or the like are formed on the gate insulating film 105, and on the gate electrodes 106 and the gate insulating film 105 there are formed a transparent first interlayer insulating film 107 and a transparent second interlayer insulating film 108. The gate electrodes 106 are disposed on the positions corresponding to the channel regions 104c of the semiconductor films 104. Further, contact holes 109, 110 respectively connected to the source regions 104a and the drain regions 104b of the semiconductor films 104 penetrating the first interlayer insulating film 107 and the second interlayer insulating film 108 are formed. And, on the second interlayer insulating film 108, transparent electrodes 112 made of ITO or the like are disposed by patterning to predetermined shapes, and one 109 of the contact holes is connected to each of the electrodes 112. Further, the other 110 of the contact holes is connected to a power supply line 111. As described above, the circuit element section 103 is provided with thin film transistors 103a for driving each connected to respective one of the electrodes 112. It should be noted that although the circuit element section 103 is also provided with holding capacitors and thin film transistors for switching, illustration of these elements are omitted in FIG. 11.

The light emitting element section 117 is provided with electrodes 112 as anodes, hole injection transportation layers 116 and each of the light emitting layers 117R, 117G, and 117B sequentially stacked on the electrodes 112, and a cathode 118 stacked thereon so as to cover the upper layer bank 115 and light emitting layers 117R, 117G, and 117B. It should be noted that by forming the cathode 118, the sealing substrate 19, and the getter material 119a with transparent materials, the emitted light could be output from the side of the sealing substrate 119.

The organic EL display device 100 is provided with scan lines (not shown) connected to the gate electrodes 106 and signal lines (not shown) connected to the source regions 104a. When the thin film transistor (not shown) for switching is turned on in accordance with a scan signal transmitted through the scan line, electrical potential of the signal line at this moment is held by the holding capacitance, and on/off state of the thin film transistor 103a for driving is determined in accordance with the state of the holding capacitance. And, via the channel region 104c of the thin film transistor 103a, electrical current flows from the power supply line 111 to the electrode 112, and further, the electrical current flows to the cathode 118 via the hole injection transportation layer 116 and each of the light emitting layers 117R, 117G, and 117B. Each of the light emitting layers 117R, 117G, and 117B emits light in accordance with the amount of electrical current flowing through the light emitting layer. The organic EL display device 100 is capable of displaying desired characters or images according to the light emission mechanism of the light emitting section 117 described above. Further, since the substrate 101 with light emitting layers 117R, 117G, and 117B each having a substantially flat cross-sectional shape and little in-plane thickness variation is provided, it has a high display quality with little display problems such as light emitting variations or brightness variations caused by uneven cross-sectional shapes.

Advantages of the fifth embodiment described above are as follows.

In the organic EL display device 100 according to the fifth embodiment, in the method of manufacturing each of the light emitting layers 117R, 117G, and 117B as the functional film, the three kinds of functional liquids (liquid substance) including light emitting layer forming materials are applied to the color element areas A and formed as films using the reduced-pressure drying method according to either one of the first through the third embodiments described above. Accordingly, the evaporation rate of the solvent in the functional liquid is optimized under the reduced pressure, and the reduced-pressure drying process is performed in a condition in which the in-plane vapor pressure distribution is substantially even. Therefore, each of the light emitting layers 117R, 117G, and 117B each having a substantially flat cross-sectional shape and small in-plane thickness variation can be formed.

In the method of manufacturing the organic EL display device 100 according to the fifth embodiment, each of the light emitting layers 117R, 117G, and 117B is manufactured using the method of manufacturing a functional film using the reduced-pressure drying method according to either one of the first through the third embodiments. Therefore, the organic EL display device 100 provided with the light emitting layers 117R, 117G, and 117B each having a substantially flat cross-sectional shape and little in-plane thickness variation can be manufactured.

The organic EL display device 100 according to the fifth embodiment is manufactured using the manufacturing method of a functional film using the reduced-pressure drying method according to either one of the first through the third embodiments, and is equipped with the light emitting layers 117R, 117G, and 117B each having a substantially flat cross-sectional shape and little in-plane thickness variation. Therefore, the organic EL display device 100 having a high display quality with little display variations such as color variations or brightness variations in the light emitting layers 117R, 117G, and 117B can be provided.

Sixth Embodiment

Figure 12:
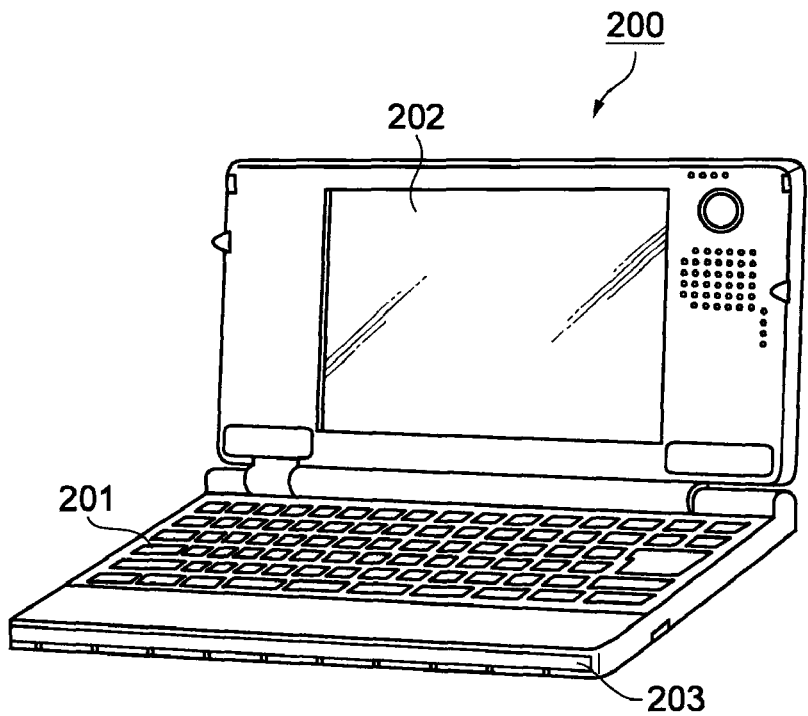
FIG. 12 is a schematic perspective view showing a portable information processing device according to an embodiment of the invention.

Now, a specific example of an electronic apparatus implementing one of the liquid crystal display device according to the fourth embodiment and the organic EL display device according to the fifth embodiment will be explained. FIG. 12 is a schematic perspective view showing a portable information processing device as an electronic apparatus. As shown in FIG. 12, the portable information processing device 200 as the electronic apparatus according to the present embodiment is equipped with a main body 203 of the information processing device and a display section 202. In the display section 202, the liquid crystal display device 50 or the organic EL display device 100 is implemented.

Advantages of the sixth embodiment described above are as follows.

The portable information processing device 200 as the electronic apparatus according to the sixth embodiment implements the liquid crystal device 50 according to the fourth embodiment having a high display quality with little display variations such as color variations or orientation variations or the organic EL display device 100 according to the fifth embodiment having a high display quality with little display variations such as variations in light emission or brightness variations. Therefore, the portable information processing device 200 capable of displaying information such as an image with a preferable visual quality can be provided.

Modified examples other than the first through sixth embodiments described above are as follows.

First Modified Example

In the reduced-pressure drying method according to the third embodiment described above, the initial pressure $P_1$ of the first chamber 1 is not limited to the atmospheric pressure (1 atm). For example, the decompression is started while communicating the first and the second chambers 1, 2 with each other, and the first chamber 1 is then sealed by closing the communication valves 8 at the decompressing pressure value intermediate between the operative pressure Ps and the atmospheric pressure. After then, the first chamber 1 can be communicated with the second chamber 2 after the second chamber 2 has reached the operative pressure Ps. According to this sequence, the time period from when the first and the second chambers 1, 2 are communicated with each other to when the pressure $P_1$ of the first chamber 1 has reached the pressure $P_2$ of the second chamber 2 can be shortened. Namely, the time necessary to perform the reduced-pressure drying operation once can be reduced.

Second Modified Example

In the reduced-pressure drying method any one of the first through the third embodiments, the substrate W coated with the liquid substance L is mounted on the mounting stage 11 in the first chamber 1, and the solvent is evaporated by reducing the pressure, but this is not a limitation. For example, the mounting stage 11 can be provided with a heating device such as a heater, and a heating step for heating the substrate W in the reduced-pressure drying process can be provided. According to this configuration, by promoting evaporation of the solvent by heating the substrate W evenly with the heating device in the heating step, the shape of the liquid substance L can more rapidly be fixed.

Third Modified Example

In the reduced-pressure drying method any one of the first through the third embodiments, the target to be dried is not limited to the substrate W coated with the liquid substance L. For example, a substance having a round outer shape such as a semiconductor wafer or glasses lens can be supported with some jigs, and then housed by the chamber.

Fourth Modified Example

A reduced-pressure drying method combining two or more of the reduced-pressure drying methods according to the first through the third embodiments can be adopted. For example, the decompressing step in the first or second embodiment can be replaced with the decompressing step in the third embodiment. Namely, the second chamber 2 is decompressed while the first chamber 1 is in a sealed condition, and the first and the second chambers 1, 2 are communicated with each other in the communicating step after the second chamber 2 has reached the predetermined operative pressure Ps. And, by performing drying of the liquid substance L while sealing the first chamber 1, the evaporation amount control type or the film shape control type of reduced-pressure drying method with shortened decompressing step for decompressing to the predetermined operative pressure Ps can be provided. Further, for example, in the reduced-pressure drying method according to the first or the second embodiment, the drying of the liquid substance if performed, and in the condition in which the film shape is stabled, the residual solvent can be evaporated using the reduced-pressure drying method according to the third embodiment.

Fifth Modified Example

In the liquid crystal display device 50 according to the fourth embodiment, the functional films formed using the reduced-pressure drying method according to any one of the first through the third embodiments are not limited to the color layers 64 and the oriented films 67, 69. For example, in the formation of the OC layer 65 for applying the liquid substance including the OC forming material and drying it, the reduced-pressure drying method according to any one of the first through the third embodiments can also be applied. Further, it is sufficient that the reduced-pressure drying method according to any one of the first through the third embodiments is used for forming either one of these functional films.

Sixth Modified Example

The electronic apparatus implementing the liquid crystal display device 50 according to the fourth embodiment or the organic EL display device 100 according to the fifth embodiment is not limited to the portable information processing device 200 according to the sixth embodiment. Apparatuses implementing a liquid crystal display device or an organic EL display device as an electro-optic device, such as a cellular phone, portable information equipment or portable terminal equipment called a personal digital assistance (PDA), a portable personal computer, a word processor, a digital still camera, in-vehicle monitor, a digital video camera, a liquid crystal television, a video cassette recorder of either a view-finder type or a direct view type, a car navigation system, a pager, an electronic organizer, an electronic calculator, a workstation, a picture phone, a POS terminal can be cited.

What is claimed is:

1. A reduced-pressure drying method, comprising:
    decompressing a second chamber communicated with a first chamber housing a base material coated with a liquid substance containing a solvent to predetermined operative pressure by a decompressing device;
    leaving the first chamber closed in response to reaching the predetermined operative pressure until the evaporated solvent raising the pressure in the first chamber to predetermined pressure;
    communicating the first chamber with the pressure raised to the predetermined pressure with the second chamber; and
    discharging the vapor of the solvent dispersed in the first and the second chambers by the decompressing device, wherein in the communicating step, the capacity of the second chamber is greater than the capacity of the first chamber.

2. The reduced-pressure drying method according to claim 1, wherein the predetermined operative pressure is higher than a vapor pressure of the solvent of the liquid substance.

3. The reduced-pressure drying method according to claim 1, wherein
    the predetermined pressure is equal to the sum of the predetermined operative pressure and a vapor pressure in the case in which a predetermined amount of the solvent evaporates in the sealed first chamber, and
    in the discharging step, the discharging is performed under the pressure higher than the predetermined pressure.

4. The reduced-pressure drying method according to claim 1, wherein the decompressing step, the leaving step, the communicating step, and the discharging step are repeated in this order until the drying is terminated.

5. The reduced-pressure drying method according to claim 1, wherein the second chamber is decompressed to be lower than the predetermined operative pressure prior to the communicating step.

6. The reduced-pressure drying method according to claim 1, wherein in the discharging step, an active discharge, in which the discharge rate of the decompressing device is increased, is performed in response to the viscosity of the liquid substance increasing so as to fix the shape of a film in accordance with evaporation of the solvent.

7. The reduced-pressure drying method according to claim 1, wherein in the discharging step, an inactive gas is introduced in the first chamber so as to keep the pressure in the first chamber higher than the predetermined operative pressure.

8. The reduced-pressure drying method according to claim 1, wherein the discharging step includes,
    dispersing the vapor of the solvent in the first chamber to the second chamber,
    isolating the first chamber from the second chamber, and
    discharging the vapor of the solvent dispersed in the second chamber by the decompressing device.

9. A method of manufacturing a functional film, comprising:
    applying a liquid substance containing a functional material to a base material; and
    the steps of the reduced-pressure drying method according to claim 1.

10. A method of manufacturing an electro-optic device, comprising:
    forming a functional film for composing a pixel on at least one of a pair of substrates using the method of manufacturing a functional film according to claim 9.

11. An electro-optic device, comprising:
    a pair of substrates; and
    a functional film provided at least one of the pair of substrates, and formed using the method of manufacturing an electro-optic device according to claim 10.

12. An electronic apparatus, comprising:
    the electro-optic device according to claim 11.

13. A liquid crystal display device, comprising:
    a pair of substrates provided with an electrode;
    an oriented film as a functional film covering the electrode in a range corresponding at least display area, and formed using the method of manufacturing a functional film according to claim 9; and liquid crystal held by the pair of substrates via the oriented film.

14. A liquid crystal display device, comprising:
a pair of substrates;
a color element as a functional film partitioned by a bank on at least one of the pair of substrates, and formed using the method of manufacturing a functional film according to claim 9; and
liquid crystal held by the pair of substrates.

15. An organic EL display device, comprising:
a pair of substrates; and
a light emitting layer as a functional film partitioned by a bank on at least one of the pair of substrates, and formed using the method of manufacturing a functional film according to claim 9.

* * * * *